(12) United States Patent
Iwata et al.

(10) Patent No.: US 7,074,676 B2
(45) Date of Patent: Jul. 11, 2006

(54) MEMORY FILM, METHOD OF MANUFACTURING THE MEMORY FILM, MEMORY ELEMENT, SEMICONDUCTOR STORAGE DEVICE, SEMICONDUCTOR INTEGRATED CIRCUIT, AND PORTABLE ELECTRONIC EQUIPMENT

(75) Inventors: Hiroshi Iwata, Nara (JP); Akihide Shibata, Nara (JP); Nobutoshi Arai, Nara (JP); Takayuki Ogura, Nara (JP); Kouichirou Adachi, Tenri (JP); Seizo Kakimoto, Nara (JP); Yukio Yasuda, 130, Gogouike, Nagakute-cho, Aichi-gun, Aichi 480-1156 (JP); Shigeaki Zaima, 5-64, Takakuradai 5-chome, Kasugai-shi, Aichi 487-0017 (JP); Akira Sakai, 6-205, Takinomizu-juutaku, 3-252, Shinonokaze, Midori-ku, Nagoya-shi, Aichi 458-0015 (JP)

(73) Assignees: Sharp Kabushiki Kaisha, Osaka (JP); Yukio Yasuda, Aichi-Gun (JP); Shigeaki Zaima, Kasugai (JP); Akira Sakai, Nagoya (JP)

( * ) Notice: Subject to any disclaimer, the term of this patent is extended or adjusted under 35 U.S.C. 154(b) by 110 days.

(21) Appl. No.: 10/468,738

(22) PCT Filed: Feb. 13, 2002

(86) PCT No.: PCT/JP02/01185

§ 371 (c)(1),
(2), (4) Date: Feb. 6, 2004

(87) PCT Pub. No.: WO02/067336

PCT Pub. Date: Aug. 29, 2002

(65) Prior Publication Data

US 2004/0115883 A1 Jun. 17, 2004

(30) Foreign Application Priority Data

Feb. 22, 2001 (JP) .......................... P2001-046260

(51) Int. Cl.
*H01L 21/8247* (2006.01)
*H01L 29/788* (2006.01)

(52) U.S. Cl. ...................... 438/260; 438/288; 438/962; 257/317

(58) Field of Classification Search ................ 257/317; 438/260, 288, 962
See application file for complete search history.

(56) References Cited

U.S. PATENT DOCUMENTS 6,090,666 A     7/2000  Ueda et al.
6,165,842 A *  12/2000  Shin et al. .................. 438/257
6,548,825 B1 *  4/2003  Yoshii et al. ................. 257/24

FOREIGN PATENT DOCUMENTS

EP        0 311 773 A2    4/1989
WO     WO 99/33120 A1    7/1999

OTHER PUBLICATIONS

English translation of Gautier—WO 99/33120.*
Tiwari et al., IEDM. pp. 521-524 (1995).
Hanafi et al., IEEE Transactions on Electron Devices, vol. 43, No. 9, pp. 1553-1558.
Tiwari et al., Appl. Phys. Lett., vol. 68, No. 10, pp. 1377-1379 (1996).

* cited by examiner

*Primary Examiner*—Chandra Chaudhari
(74) *Attorney, Agent, or Firm*—Birch, Stewart, Kolasch & Birch, LLP

(57) ABSTRACT

A memory film operable at a low voltage and a method of manufacturing the memory film; the method, comprising the steps of forming a first insulation film (112) on a semiconductor substrate (111) forming a first electrode, forming a first conductor film (113) on the first insulation film (112), forming a second insulation film (112B) on the surface of the first conductor film (113), forming a third insulation film containing conductor particulates (114, 115) on the second insulation film (112B), and forming a second conductor film forming a second electrode on the third insulation film.

26 Claims, 20 Drawing Sheets

MEMORY FILM, METHOD OF MANUFACTURING THE MEMORY FILM, MEMORY ELEMENT, SEMICONDUCTOR STORAGE DEVICE, SEMICONDUCTOR INTEGRATED CIRCUIT, AND PORTABLE ELECTRONIC EQUIPMENT

This application is the national phase under 35 U.S.C. § 371 of PCT International Application No. PCT/JP02/01185 which has an International filing date of Feb. 13, 2002, which designated the United States of America.

TECHNICAL FIELD

The present invention relates to a memory film, a method of manufacturing the memory film, a memory element, a semiconductor storage device, a semiconductor integrated circuit and portable electronic equipment. The invention relates more concretely to a memory film that contains conductor particles, a method of manufacturing the memory film and a memory element that has such a memory film. The invention further relates to a semiconductor storage device, a semiconductor integrated circuit and portable electronic equipment, which have such a memory element.

BACKGROUND ART

As a prior art that employs a field-effect transistor, in which a memory film for accumulating electric charges in its gate insulation film, as a memory element, there can be enumerated a flash memory. The flash memory has a conductor film, which is called a floating gate in its insulation film located between its control gate and its channel region. The quantity of charges in the floating gate is changed by injecting or discharging electrons from the channel region to the floating gate by FN (Fowler-Nordheim) tunneling, and the quantity of charges is retained as storage information. In reading the stored information, the quantity of charges in the floating gate can be detected as a difference in the threshold of the field-effect transistor.

However, according to the above-mentioned prior art, there has been a problem that the operating voltages have been high. As an example of operation of the flash memory, for example, a voltage of –8 V is applied to the selected word line and a voltage of 6 V is applied to the selected bit line during write. A voltage of 10 V is applied to the selected word line and a voltage of –8 V is applied to the bit line during erase. Since the operating voltages have been high as described above, the consumption power during write and erase have been large, and this has hindered a reduction in the consumption power. Moreover, since a high electrical field is applied to the gate insulation film, element deterioration has been a problem.

DISCLOSURE OF THE INVENTION

The present invention is made to solve the aforementioned problems and has the object of providing a memory film operable at a low voltage and a method of manufacturing the memory film. Another object of the present invention is to provide a memory element that has such a memory film. A further object of the present invention is to provide a semiconductor storage device, a semiconductor integrated circuit and portable electronic equipment, which have such a memory element.

In order to achieve the above object, there is provided a memory film manufacturing method comprising the steps of:

forming a first insulation film on a semiconductor substrate that becomes a first electrode;

forming a first conductor film on the first insulation film;

forming a second insulation film on a surface of the first conductor film;

forming a third insulation film containing conductor particles on the second insulation film; and forming a second conductor film that becomes a second electrode on the third insulation film.

In this specification, the term of "particle" means a particle that has a dimension on the order of nanometers (nm).

According to the memory film manufacturing method of the above-mentioned first inventive aspect, the first conductor film is formed on the semiconductor substrate via the first insulation film. The third insulation film containing the conductor particles is formed on the first conductor film via the second insulation film. The second conductor film is formed on the third insulation film. Therefore, the semiconductor substrate and the second conductor film become electrodes, while the first conductor film and the third insulation film containing the conductor particles become a charge storage section, forming a memory film. The memory film formed as described above permits write, erase and nondestructive read at a low voltage.

In one embodiment of the present invention, the step of forming the third insulation film containing the conductor particles on the second insulation film is comprised of repeating at least one time a sequence of the steps of:

forming conductor particles on the second insulation film; and forming a third insulation film on surfaces of the conductor particles.

According to the above-mentioned embodiment, by executing the sequence of processes at least one time, the memory effect, which has not been observed when the sequence of processes is not executed, can be produced.

In one embodiment of the present invention, the sequence of steps is carried out two times or three times.

According to the above-mentioned embodiment, the short-channel effect is restrained concurrently with the obtainment of a remarkable memory effect, facilitating the miniaturization of the element.

In one embodiment of the present invention, the first conductor film is comprised of a semiconductor, the conductor particles are comprised of a semiconductor, the step of forming the first insulation film on the semiconductor substrate, the step of forming the second insulation film on the surface of the conductor film and the step of forming the third insulation film on the surfaces of the conductor particles are comprised of a thermal oxidation process, and the step of forming the first conductor film on the first insulation film, and the step of forming the conductor particles on the second insulation film are comprised of a chemical vapor deposition method.

According to the above-mentioned embodiment, the first conductor film and the conductor particles are each constructed of a semiconductor, and the processes for forming the first insulation film, the second insulation film and the third insulation film are thermal oxidation processes. Moreover, the first conductor film and the conductor particles are each formed by the chemical vapor deposition method. That is, the memory effect appears with good reproducibility by merely repeating the thermal oxidation process and the chemical vapor deposition method. Therefore, a memory film of stable electrical characteristics can be formed through simple processes.

In one embodiment of the present invention, the first conductor film is comprised of a polycrystalline semiconductor or an amorphous semiconductor.

According to the above-mentioned embodiment, with regard to the conditions of forming the first conductor film, there can be used conditions similar to those of the processes for forming the floating gate of the flash memory widely manufactured. Moreover, the conditions of forming the first conductor film can be used without modification for the processes for forming the conductor particles on the second insulation film. Therefore, the processes and the conditioning of the processes can be simplified.

In one embodiment of the present invention, the semiconductor substrate is comprised of a silicon substrate, the first conductor film is comprised of silicon, the first through third insulation films are each comprised of a silicon oxide film, and the conductor particles are each comprised of silicon.

According to the above-mentioned embodiment, by using silicon, which is most widely used, as a material of LSI, it becomes easy to mount the element that uses the memory film of the present invention together with other elements. Moreover, since the very highly developed silicon process can be used, the manufacturing is facilitated.

Also, there is provided a memory film manufacturing method comprising the steps of:

forming a first insulation film on a semiconductor substrate;

forming an amorphous semiconductor film on the first insulation film;

cleaning the amorphous semiconductor film by exposure to atmosphere after the step of forming the amorphous semiconductor film;

producing a semiconductor nucleus by introducing gas containing either one or both of $Si_2H_6$ gas and $SiH_4$ gas onto the amorphous semiconductor film;

forming a first oxide film by thermally oxidizing part of the amorphous semiconductor film and part of the semiconductor nucleus and then forming first semiconductor particles; and forming a second conductor film on the first oxide film.

Also, by the memory film manufacturing method of the above-mentioned second inventive aspect, a memory film of a structure similar to that of the memory film formed by the memory film manufacturing method of the first inventive aspect can be formed. Therefore, effects and operation similar to those of the memory film manufacturing method of the first inventive aspect are produced.

Furthermore, the formation density of the silicon particles can be controlled by merely changing the time of supply of the gas in the process for generating the semiconductor nucleus by introducing either one or both of the $Si_2H_6$ gas and the $SiH_4$ gas. This therefore facilitates the control of the characteristics of the memory film.

Also, there is provided a memory film manufacturing method comprising the steps of:

forming a first insulation film on a semiconductor substrate;

forming an amorphous semiconductor film on the first insulation film;

cleaning the amorphous semiconductor film by exposure to atmosphere after the step of forming the amorphous semiconductor film;

producing a semiconductor nucleus by introducing gas containing either one or both of $Si_2H_6$ gas and $SiH_4$ gas onto the amorphous semiconductor film;

forming a first oxide film by thermally oxidizing part of the amorphous semiconductor film and part of the semiconductor nucleus and then forming first semiconductor particles;

forming second conductor particles on the first oxide film;

forming a third insulation film on surfaces of the second conductor particles; and forming a second conductor film on the third insulation film.

Also, by the memory film manufacturing method of the above-mentioned third inventive aspect, effects and operation similar to those of the memory film manufacturing method of the second inventive aspect are produced. Furthermore, the second conductor particles are formed in addition to the first semiconductor particles, and therefore, a memory film of a structure similar to the structure, in which the aforementioned sequence of processes of one embodiment of the first inventive aspect is carried out two times, is formed. Therefore, a memory film having a remarkable memory effect is obtained.

Also, there is provided a memory film manufacturing method comprising the steps of:

forming a first insulation film on a semiconductor substrate;

forming an amorphous semiconductor film on the first insulation film;

producing a semiconductor nucleus by introducing gas containing either one or both of $Si_2H_6$ gas and $SiH_4$ gas onto the amorphous semiconductor film without exposure to atmosphere after the step of forming the amorphous semiconductor film;

forming a first oxide film by oxidizing part of the amorphous semiconductor film and part of the semiconductor nucleus through thermal oxidation and then forming first semiconductor particles; and forming a second conductor film on the first oxide film.

Also, by the memory film manufacturing method of the above-mentioned fourth inventive aspect, effects and operation similar to those of the memory film manufacturing method of the second inventive aspect are produced. Furthermore, the gas containing either one or both of the $Si_2H_6$ gas and the $SiH_4$ gas is introduced onto the amorphous semiconductor film without exposure to atmosphere after the process of forming the amorphous semiconductor film. Therefore, the amorphous semiconductor film is not contaminated, and the generation of the semiconductor nucleus is stabilized. Therefore, variation in the characteristics of the memory film can be reduced.

Also, there is provided a memory film manufacturing method comprising the steps of:

forming a first insulation film on a semiconductor substrate;

forming an amorphous semiconductor film on the first insulation film;

producing a semiconductor nucleus by introducing gas containing either one or both of $Si_2H_6$ gas and $SiH_4$ gas onto the amorphous semiconductor film without exposure to atmosphere after the step of forming the amorphous semiconductor film;

forming a first oxide film by oxidizing part of the amorphous semiconductor film and part of the semiconductor nucleus through thermal oxidation and then forming first semiconductor particles;

forming second conductor particles on the first oxide film;

forming a third insulation film on surfaces of the second conductor particles; and forming a second conductor film on the third insulation film.

Also, by the memory film manufacturing method of the above-mentioned fifth inventive aspect, effects and operation similar to those of the memory film manufacturing method of the fourth inventive aspect are produced. Furthermore, the second conductor particles are formed in addition to the first semiconductor particles. Therefore, a memory film of a structure similar to the structure, in which the aforementioned sequence of processes of one embodiment of the first inventive aspect is carried out two times, is formed. Therefore, a memory film having a remarkable memory effect is obtained.

In one embodiment of the present invention, the semiconductor nucleus is grown by carrying out annealing without exposure to atmosphere after the step of generating the semiconductor nucleus by introducing gas containing either one or both of $Si_2H_6$ gas and $SiH_4$ gas onto the amorphous semiconductor film.

According to the above-mentioned embodiment, the semiconductor nucleus can be controlled to an appropriate size, and the characteristics of the memory film can be optimized.

Also, there is provided a memory film comprising:

a semiconductor substrate that becomes a first electrode;

a first insulation film formed on the conductor substrate;

a first conductor film formed on the first insulation film;

a third insulation film containing conductor particles formed on the first conductor film; and a second conductor film that becomes a second electrode formed on the third insulation film.

According to the above-mentioned construction, the semiconductor substrate and the second conductor film become electrodes, while the first conductor film and the third insulation film containing the conductor particles become a charge storage section, constituting a memory film. This memory film executes write and erase at a low voltage (±3 V, for example) and has a hysteresis characteristic. Moreover, since the storage is not destroyed at, for example, 1 V, nondestructive read is possible. Therefore, remarkably low voltage operation is possible in comparison with the memory film of the prior art flash memory. Moreover, by virtue of the possible low-voltage operation, the deterioration of the memory film can be restrained. Therefore, according to the memory film of the sixth inventive aspect, a memory film of a low operating voltage and high reliability is provided.

In one embodiment of the present invention, positions of the conductor particles contained in the third insulation film are substantially random.

According to the above-mentioned embodiment, the memory characteristic appears with good reproducibility, and there is no need to control the positions of the conductor particles contained in the third insulation film. Therefore, a memory film can be manufactured with good reproducibility through simple processes.

In one embodiment of the present invention, the conductor particles contained in the third insulation film comprise:

first conductor particles located adjacent to the first conductor film; and second conductor particles located obliquely upwardly adjacent to the first semiconductor particles, and the positions of the first conductor particles projected on a plane of the first conductor film are substantially random.

According to the above-mentioned embodiment, a memory film having a remarkable memory effect can be obtained, and there is no need to control the positions of the conductor particles contained in the third insulation film. Therefore, a memory film having a remarkable memory effect can be manufactured through simple processes.

In one embodiment of the present invention, assuming that a diameter or a height of the conductor particles is H, assuming that a distance between the first conductor film and the first conductor particles is S1, and assuming that an average of a thickness of the third insulation film is W, then there is satisfied the relation:

$$W \leq 2H + S_1.$$

According to the above-mentioned embodiment, a greater number of the second conductor particles are located obliquely above the first conductor particles, and a smaller number of particles are located right above. Therefore, the thickness of the memory film is reduced to allow the electrostatic capacity to be increased. For example, if this memory film is introduced into the gate insulation film of a field-effect transistor, then the effective thickness of the gate insulation film can be reduced to allow the short-channel effect to be restrained and allow the miniaturization of the memory element to be achieved.

In one embodiment of the present invention, the semiconductor substrate is a silicon substrate, the first conductor film is comprised of silicon, the first and third insulation films are each comprised of a silicon oxide film, and the conductor particles are comprised of silicon.

According to the above-mentioned embodiment, by using silicon, which is most widely used as the material of LSI, it is easy to mount the element that employs the memory film together with other elements. Moreover, since the very highly developed silicon process can be used, the manufacturing is facilitated.

In one embodiment of the present invention, a thickness of the first insulation film is 2 nm to 5 nm, and a diameter of the conductor particles is 3 nm to 7 nm.

According to the above-mentioned embodiment, the thickness of the first insulation film is set to 2 nm to 5 nm. This arrangement therefore enables the prevention of the reduction in the storage retention time as a consequence of an increased probability of the occurrence of electric charges penetrating the silicon oxide film due to the tunneling phenomenon and the removal of difficulties in miniaturizing the element as a consequence of an enhanced short-channel effect. Moreover, the diameter of the conductor particles is set to 3 nm to 7 nm. This arrangement therefore enables the elimination of the necessity of a high voltage for the movement of electric charges as a consequence of an enhanced quantum size effect and the removal of difficulties in miniaturizing the element as a consequence of an enhanced short-channel effect. Therefore, a memory element, which has a long storage retention time and a low operating voltage and is easy to miniaturize, is provided.

Moreover, the memory element of the seventh inventive aspect, a gate insulation film of a field-effect trasistor of which is comprised of the above memory film.

The memory element of the above-mentioned seventh inventive aspect is a field-effect transistor type memory element that employs the memory film of the sixth inventive aspect as the gate insulation film thereof. With this arrangement, it is possible to execute write and erase at a voltage of, for example, ±3 V and nondestructive read at a voltage of 1

V. Therefore, remarkably low voltage operation in comparison with the prior art flash memory is possible, and this allows low power consumption to be achieved, improving the reliability of the element.

In one embodiment of the present invention, the memory element is formed on a SOI substrate.

According to the above-mentioned embodiment, the junction capacitance between the source region and the drain region and the body can be remarkably reduced. Furthermore, if a SOI substrate is employed, it is easy to shallow the depth of the source region and the drain region, allowing the short-channel effect to be restrained and allowing the memory element to be further miniaturized.

The semiconductor integrated circuit of the eighth inventive aspect is characterized in that the memory element of the seventh inventive aspect is integrated.

According to the above-mentioned inventive aspect, a memory integrated circuit, which can operate on a low power voltage and has low power consumption, is provided.

The semiconductor storage device of the ninth inventive aspect is characterized in that element isolation regions that extend meandering in a first direction on a surface of a semiconductor substrate are formed so as to be arranged parallel in a second direction perpendicular to the first direction, defining active regions that extend meandering in the first direction between mutually adjacent ones of the element isolation regions, impurity diffusion regions, which operate as a source region or a drain region, are formed at turn portions of the meander in each of the active regions, are formed defining channel regions between mutually adjacent ones of the impurity diffusion regions in an identical active region, a plurality of word lines, which extend straightly in the second direction perpendicular to the first direction, are provided on the semiconductor substrate so as to extend over the channel regions in each of the active regions via the above-mentioned memory film, first bit lines, which extend in the first direction, are provided on the semiconductor substrate so as to extend over the impurity diffusion regions provided at the turn portions on one side of the meander in the identical active region, second bit lines, which extend in the first direction, are provided so as to extend over the impurity diffusion regions provided at the turn portions on the other side of the meander in the identical active region, the first bit lines and the second bit lines are connected to the impurity diffusion regions existing right thereunder via contact holes, and the semiconductor substrate has a well region on a surface side, the well region being segmented by the element isolation regions.

According to the above-mentioned construction, the memory film of the sixth inventive aspect is employed as the memory film of each memory cell, and therefore, low-voltage operation is possible. Moreover, the area of one cell can be reduced to $4F^2$ (F is a minimum processing pitch), which is smaller than that of the conventional AND type memory cell array. Therefore, it is possible to achieve low power consumption, high reliability and high integration.

The semiconductor storage device of the tenth inventive aspect is characterized in that element isolation regions, which extend meandering in a first direction, are formed on a surface of a semiconductor substrate so as to be arranged parallel in a second direction perpendicular to the first direction, defining active regions that extend meandering in the first direction between mutually adjacent ones of the element isolation regions, impurity diffusion regions, which operate as a source region or a drain region, are formed at turn portions of the meander in each of the active regions, defining channel regions between mutually adjacent impurity diffusion regions in an identical active region, a plurality of word lines, which extend in the second direction perpendicular to the first direction, are provided on the semiconductor substrate so as to extend over the channel regions in each of the active regions via the above-mentioned memory film, first bit lines, which extend in the first direction, are provided on the semiconductor substrate so as to extend over the impurity diffusion regions provided at the turn portions on one side of the meander in the identical active region, second bit lines, which extend in the first direction, are provided so as to extend over the impurity diffusion regions provided at the turn portions on the other side of the meander in the identical active region, the first bit lines and the second bit lines are connected to the impurity diffusion regions existing right thereunder via contact holes, and a SOI substrate, which has a body comprised of silicon, is provided as the semiconductor substrate on an insulator, the body of the SOI substrate constituting the active regions.

According to the semiconductor storage device of the above-mentioned tenth inventive aspect, effects and operation similar to those of the semiconductor storage device of the ninth inventive aspect are produced.

Furthermore, by virtue of the thick embedded oxide film, the electrostatic capacitance between the body and the substrate can be remarkably reduced. Moreover, if the SOI substrate is employed, then the junction capacitance between the source region and the drain region and the body can be remarkably reduced. Therefore, consumption current for charging the capacitance can be reduced. Furthermore, if the SOI substrate is employed, it is easy to shallow the depth of the source region and the drain region, allowing the short-channel effect to be restrained and allowing the element to be further miniaturized. Therefore, low power consumption and miniaturization can be achieved.

In one embodiment of the present invention, a portion of the word lines, the portion being located on the channel region, constitutes a gate electrode.

According to the above-mentioned embodiment, part of the word line is used as the gate electrode, and there is no need to employ a contact and an upper interconnection for the connection of the gate electrode with the word line. Therefore, the structure of the memory cell is simplified, and the manufacturing processes can be reduced. Therefore, the manufacturing cost can be reduced.

In one embodiment of the present invention, during write and erase, when an absolute value V of a potential difference between the word line and the body is $V=V_{DD}$ in a selected memory cell, there is a relation: $V_{DD}/3 \leq V < V_{DD}/2$ in a memory cell connected only to either one of the selected word line or the selected bit line.

According to the above-mentioned embodiment, a ratio of the voltage applied to the memory film of the selected memory cell to the maximum value of the voltage applied to the memory film of the nonselected memory cell is large. This arrangement allows the provision of a memory that permits random access and has a large operating margin.

The semiconductor integrated circuit of the eleventh inventive aspect is characterized in that the above-mentioned semiconductor storage device and a logic circuit are mounted together.

According to the semiconductor integrated circuit of the above-mentioned eleventh inventive aspect, the cell area of the semiconductor storage device of the ninth or tenth inventive aspect can be reduced to $4F^2$, which is smaller than the memory cell area of the ordinary one-transistor type nonvolatile memory, and therefore, the area occupied by the memory can be reduced. The areas of the logic circuit and other memories can be made larger by that much, and this allows the functions to be improved. Otherwise, the storage capacity of the memory can be made large. In the above case, for example, it is possible to temporarily read a large-scale program, retain the program even after the cut-off of power supply and to execute the program even after the power is turned on again, and it is also possible to replace the program with another program. Therefore, the integration of the integrated circuit can be improved, allowing the functions to be improved.

The portable electronic equipment of the twelfth inventive aspect is provided with the semiconductor integrated circuit of the eighth or eleventh inventive aspect.

According to the above-mentioned twelfth inventive aspect, the LSI section is allowed to have high functions and low power consumption. Therefore, portable electronic equipment of high functions and long battery life is provided.

BEST MODE FOR CARRYING OUT THE INVENTION

The following embodiments of the memory films are described on the basis of a silicon substrate employed as a semiconductor substrate. However, the present invention is not limited to this so long as the substrate is a semiconductor. The following embodiments are described on the basis of an N-channel type element served as a memory. However, a P-channel type element may be employed as a memory. In this case, the conductive types of impurities are required to be all inverted.

FIRST EMBODIMENT

The first embodiment of the present invention will be described with reference to FIGS. 1 through 6. The present embodiment is related to a memory film capable of retaining electric charges and a method of manufacturing the memory film.

For the provision of a memory film capable of injecting and discharging electric charges at a low voltage, a memory film was formed according to the procedure shown in FIGS. 1A through 1D and 2E and 2F.

First of all, a silicon oxide film 112 of a thickness of 2 nm was formed on a silicon substrate 111 in an $N_2O$ atmosphere at a temperature of 900° C. It is to be noted that the chemical vapor deposition method (CVD method) can also be used for the formation of this silicon oxide film 112. When a field-effect transistor is formed its gate oxide film is made preferably by the thermal oxidation method having a little dencity of surface state.

Figure 1A:
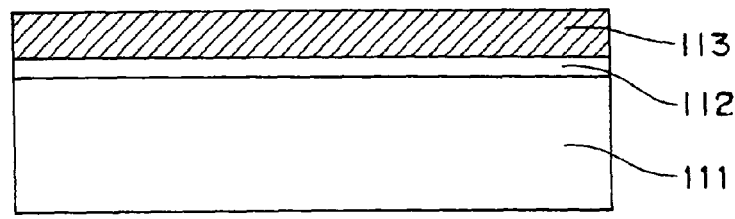
FIGS. 1A through 1D are views showing a memory film manufacturing method according to a first embodiment of the present invention.

Next, polysilicon was grown in an $SiH_4$ atmosphere at a temperature of 620° C. by the low-pressure chemical vapor deposition method (LPCVD method), and consequently the polysilicon was grown in a layer shape, forming a polysilicon film 113 of a thickness of 5 nm (FIG. 1A).

Figure 1B:
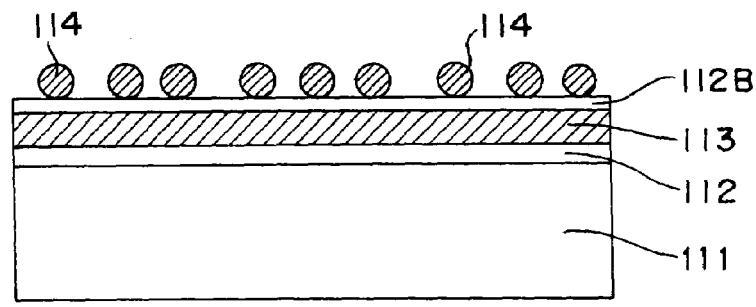

Next, the polysilicon film 113 was oxidized in an $N_2O$ atmosphere at a temperature of 900° C., and a silicon oxide film 112B of a thickness of 2 nm was formed. Subsequently, when silicon was grown in an $SiH_4$ atmosphere at a temperature of 620° C. by the LPCVD method, it was consequently discovered that the silicon was not grown in a layer shape and silicon particles were formed in scattered dots. That is, although a polysilicon film was grown in a layer shape on an oxide film formed by thermally oxidizing a silicon single crystal substrate, the silicon particles were formed in scattered dots on the oxide film formed by thermally oxidizing the polysilicon film even if same silicon growth conditions were used. Thus, first silicon particles 114 were formed on the surface of the silicon oxide film 112B (FIG. 1B). In a plane along the surface of the silicon oxide film 112B, the positions where the first silicon particles 114 were formed were substantially random.

Figure 1C:
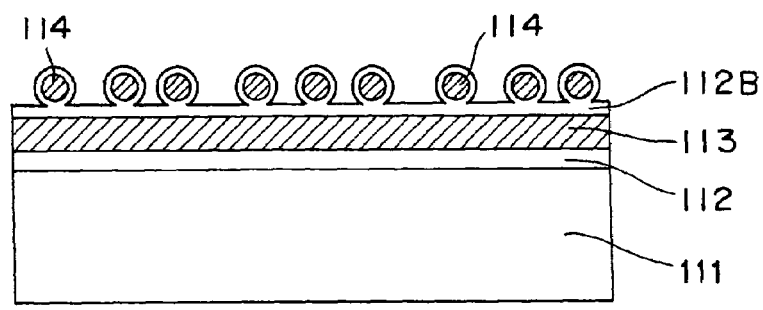

Subsequently, through oxidation in an $N_2O$ atmosphere at a temperature of 900° C., the surfaces of the first silicon particles 114 were oxidized, but crystalline silicon remained inside (FIG. 1C). The remaining first silicon particles 114 had a diameter of about 5 nm.

Figure 1D:
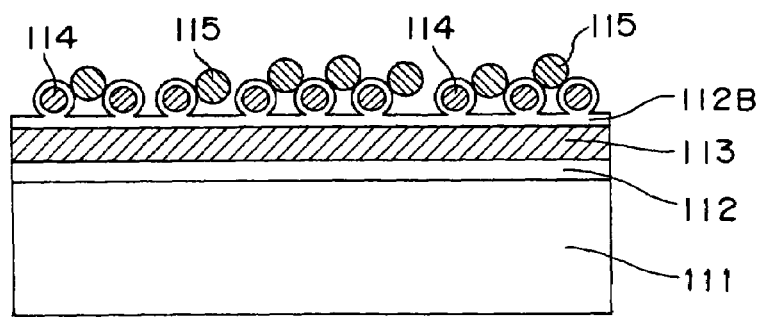

Subsequently, when silicon was grown in an $SiH_4$ atmosphere at a temperature of 620° C. by the LPCVD method, silicon particles were formed in scattered dots, forming second silicon particles 115 (FIG. 1D). With regard to the second silicon particles 115, there were many particles adjacently formed obliquely above the first silicon particles 114 via a silicon oxide film. However, the positions where the second silicon particles 115 were formed were substantially random in the planar direction similarly to the positions where the first silicon particles 114 were formed.

Figure 2E:
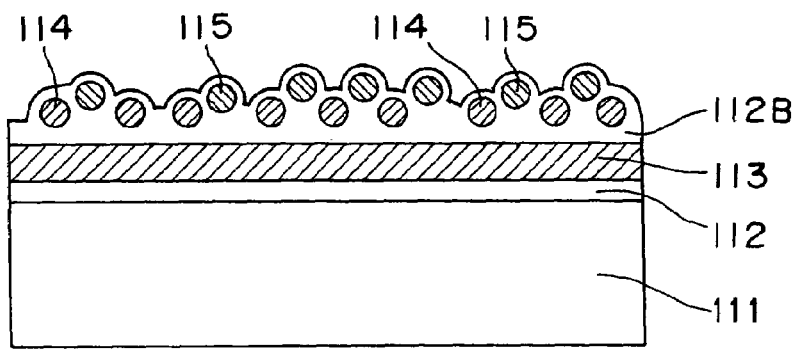
FIGS. 2E and 2F are views showing a memory film manufacturing method according to a first embodiment of the present invention.

Subsequently, through oxidation in an $N_2O$ atmosphere at a temperature of 900° C., the surfaces of the second silicon particles 115 were oxidized, but crystalline silicon remained inside (FIG. 2E). The remaining second silicon particles 115 had a diameter of about 5 nm.

Figure 2F:
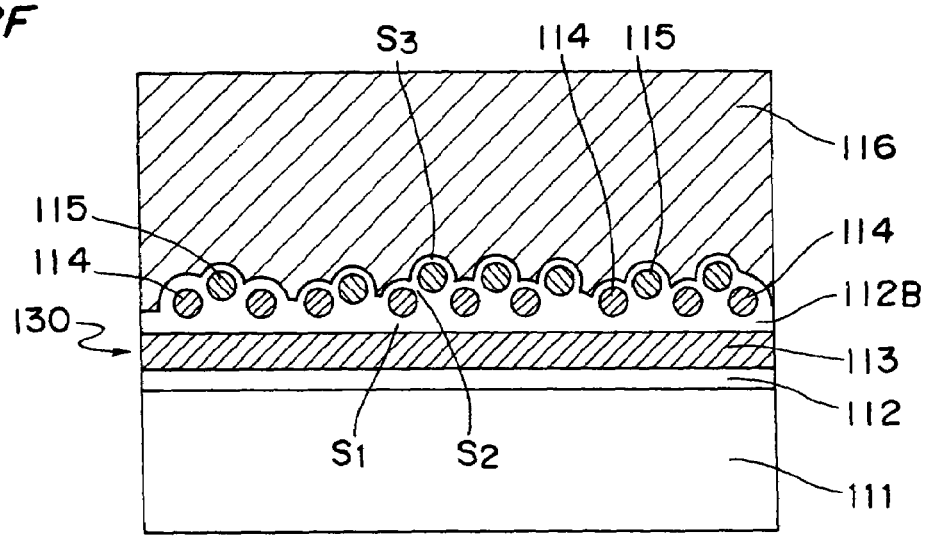

Subsequently, a polysilicon film, which became an electrode, was formed by the LPCVD method (FIG. 2F). Through these processes, a memory film 130 placed between the silicon substrate 111 that became an electrode and an electrode polysilicon film 116 were completed. The number density of the silicon particles inclusive of the first silicon particles 114 and the second silicon particles 115 was about $3 \times 10^{11}$ cm$^{-2}$.

According to the aforementioned manufacturing procedure, the thermal oxidation process and the LPCVD process were merely repeated four times and three times, respectively, when forming the memory film 130, and the positions where the silicon particles were formed were not controlled at all. However, a thickness S1 of the oxide film that separates the polysilicon film 113 from the first silicon particles 114 is almost constant. Likewise, a thickness S2 of the oxide film that separates the first silicon particles 114 from the second silicon particles 115 (nearest neighbor distance between the first silicon particle and the second silicon particle) is almost constant regardless of places, and a thickness S3 of the oxide film that separates the second silicon particles 115 from the electrode polysilicon film 116 is almost constant. Therefore, a memory film 130 whose electrical characteristics are stable can be formed through simple processes. In order to make the oxide film thickness constant as described above, it is most appropriate to use thermal oxidation that can easily control the oxide film thickness as shown in the aforementioned manufacturing procedure. It is to be noted that the oxidation of the polysilicon film 113, the oxidation of the first silicon particles 114 and the oxidation of the second silicon particles 115 can each be replaced by the deposition of an oxide film by the CVD method.

Figure 3:
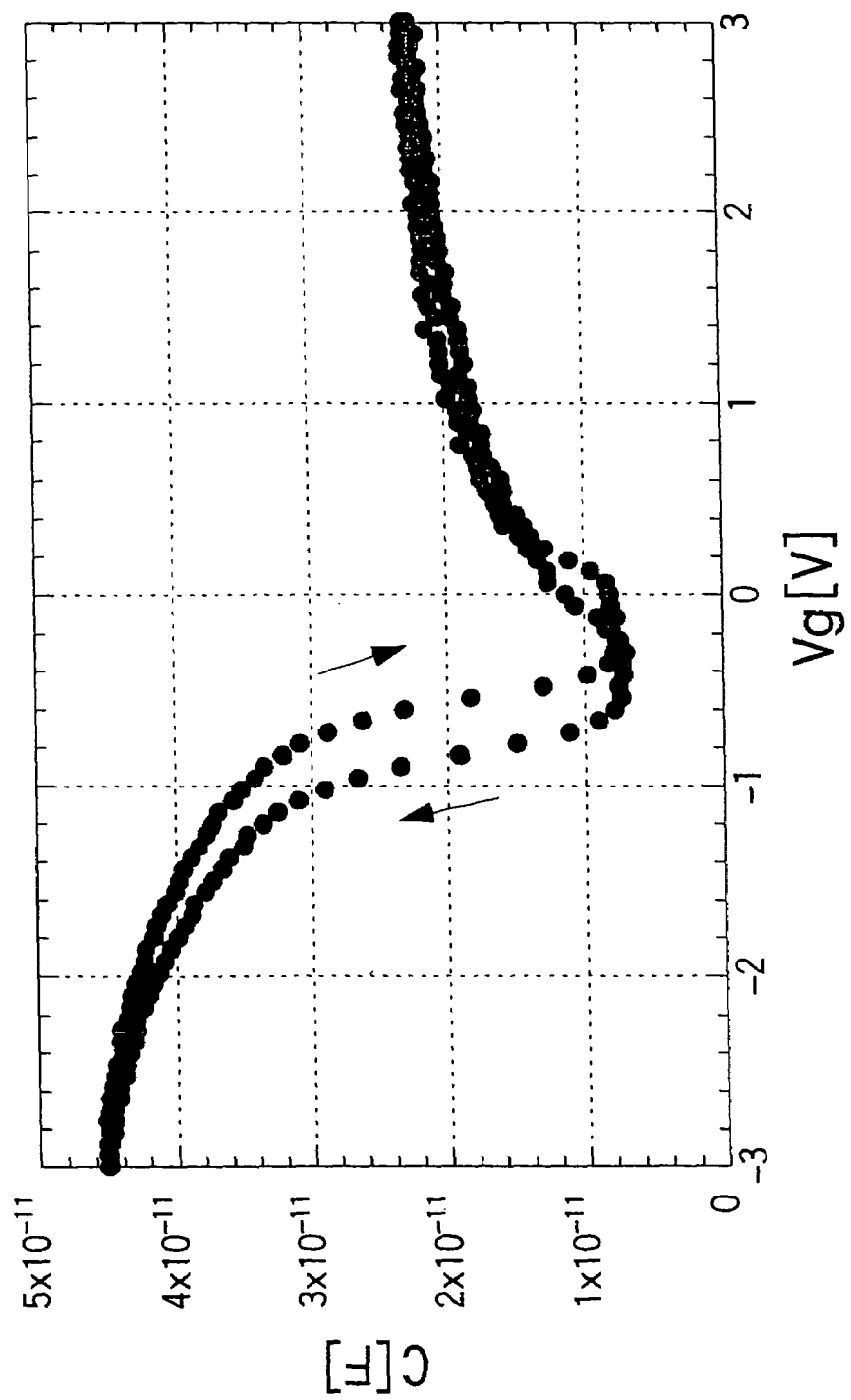
FIG. 3 is a graph showing a change in capacitance when a voltage applied to the memory film of the first embodiment of the present invention is scanned.
Figure 4:
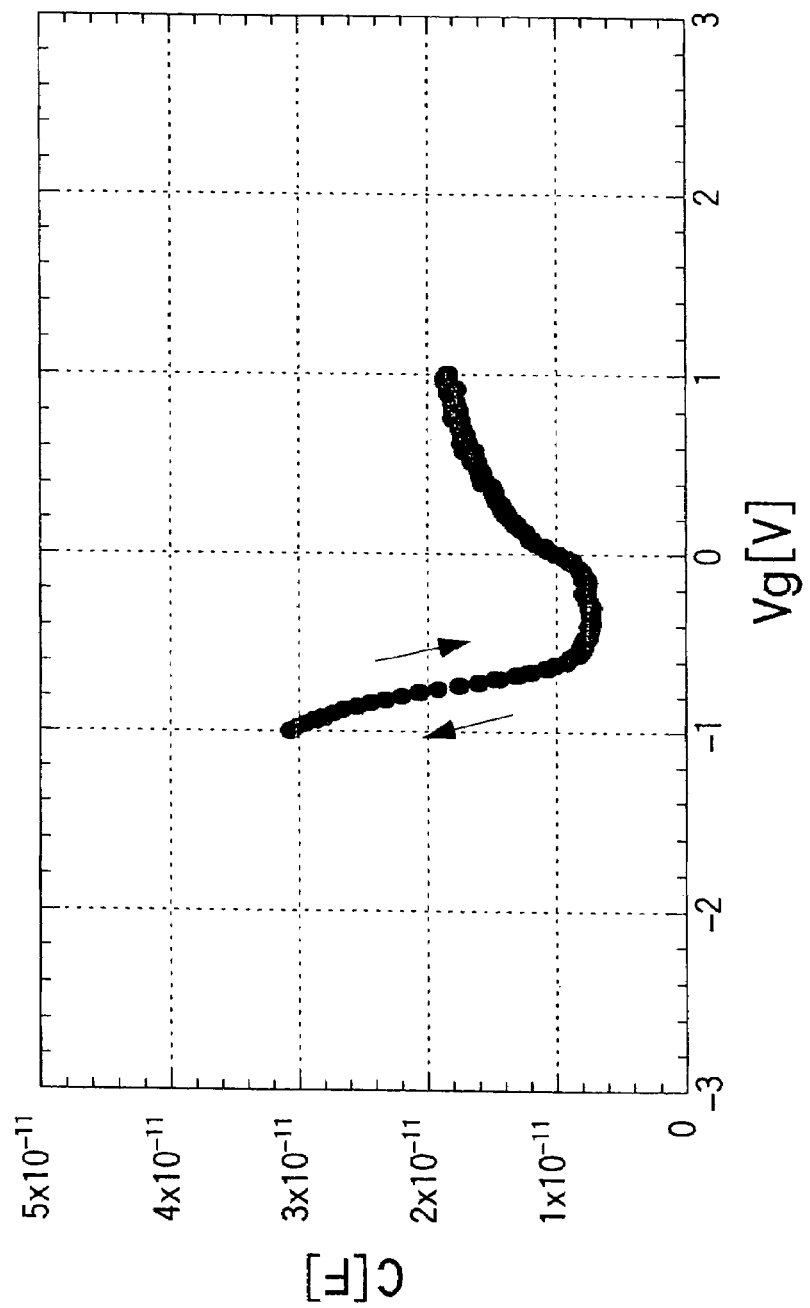
FIG. 4 is a graph showing a change in capacitance when a voltage applied to the memory film of the first embodiment of the present invention is scanned.

The characteristics of the memory film 130 produced according to the aforementioned procedure are shown next. FIGS. 3 and 4 are graphs showing the relation between the capacitance and the voltage of the memory film 130. FIG. 3 shows the characteristic when a voltage Vg is scanned from +3 V to −3 V and thereafter scanned again to +3 V. FIG. 4 is the characteristic when the voltage Vg is scanned from +1 V to −1 V and thereafter scanned again to +1 V. In FIGS. 3 and 4, Vg represents the voltage applied to the electrode polysilicon film 116 with respect to the silicon substrate 111, and C represents the electrostatic capacity per unit area. It was discovered from FIG. 3 that write was executed in the memory film when the voltage Vg became −3 V, and the graph shifted to the right, exhibiting a hysteresis characteristic. Although not shown, it was discovered that erase was executed according to the restoration of the graph when Vg became +3 V. On the other hand, it was discovered that the hysteresis characteristic did not appear and neither write nor erase was executed within a range in which Vg is ±1 V. When the above-mentioned procedure for producing the memory film 130 was used, the aforementioned characteristics appeared with good reproducibility.

The voltages at which write and erase starts are executed were changed depending on the amount of oxidation of the polysilicon film 113. The amount of oxidation of the polysilicon film 113 was 2 nm in the aforementioned example. When the amount of oxidation was set at 1.5 nm, write was executed when Vg was set at −1.5 V, and erase was executed when Vg was set at 1.5 V. At this time, neither write nor erase was executed when Vg=±0.5 V.

Figure 5A:
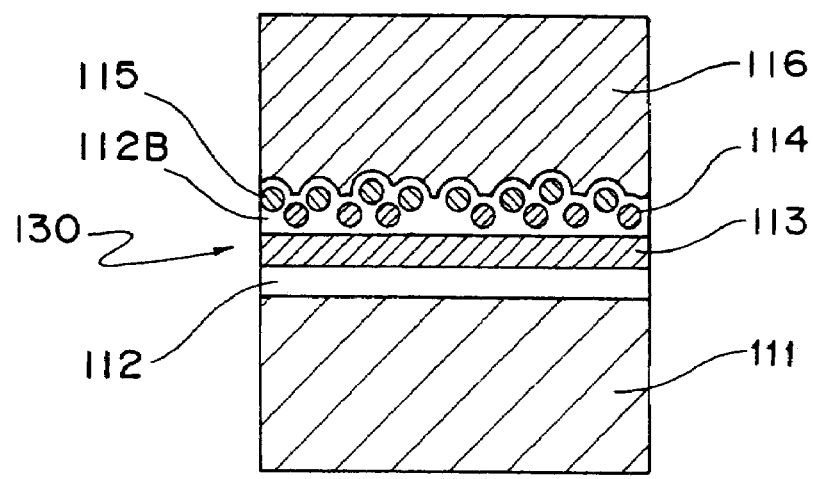
FIGS. 5A and 5B are sectional views of the memory film of the first embodiment of the present invention.
Figure 5B:
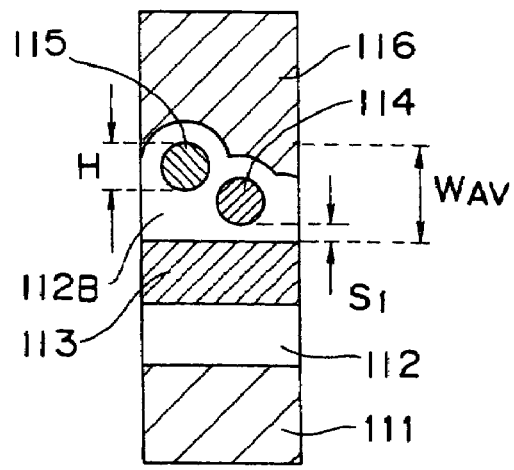
Figure 6A:
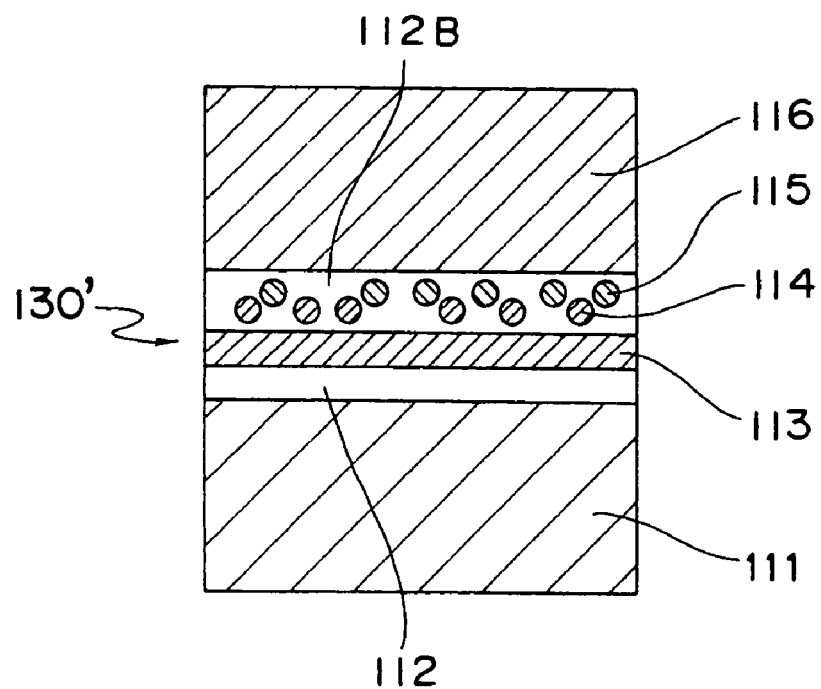
FIGS. 6A and 6B are sectional views of the memory film of the first embodiment of the present invention.
Figure 6B:
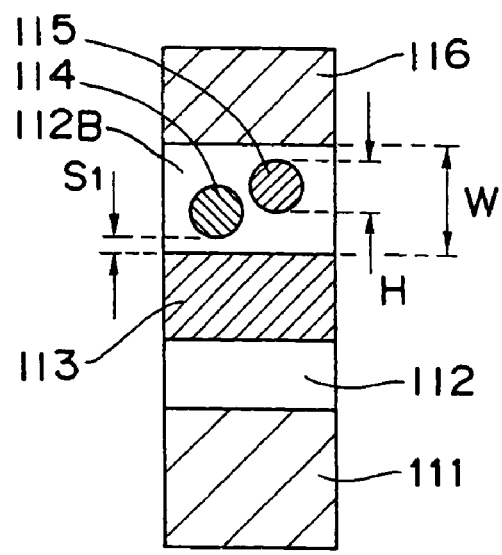

FIGS. 5A, 5B, 6A and 6B are detailed sectional views of the memory film 130 of the present embodiment. FIGS. 5A and 5B are sectional views when the memory film 130 is produced by thermally oxidizing the first silicon particles 114 and the second silicon particles 115. FIGS. 6A and 6B are sectional views when a memory film 130' is produced by depositing an oxide film by the CVD method instead of thermally oxidizing the first silicon particles 114 and the second silicon particles 115. FIGS. 5B and 6B are enlarged views of FIGS. 5A and 6A, respectively. As is apparent from FIGS. 5B and 6B compared with each other, an interface between the electrode polysilicon film 116 and the oxide film 112B has more significant unevenness when the first silicon particles 114 and the second silicon particles 115 are thermally oxidized than when the oxide film is deposited by the CVD method on the first silicon particles 114 and the second silicon particles 115.

Although the silicon substrate is employed as the substrate, the present invention is not limited to this so long as the substrate is a semiconductor. Moreover, the material of the electrode polysilicon film 116 is not limited to this but required to have electric conductivity, the material being exemplified by a semiconductor of germanium, gallium arsenide or the like or a metal of aluminum, copper, silver, gold or the like.

The polysilicon film 113 is formed on the silicon substrate 111 via the silicon oxide film 112. A silicon oxide film 112B exists between the polysilicon film 113 and the electrode polysilicon film 116, and silicon particles are formed in this silicon oxide film 112B. The silicon particles can be categorized into two kinds depending on the positions. One is the first silicon particle 114 located near the polysilicon film 113. The other one is the second silicon particle 115 located obliquely above the silicon particle 114.

The materials of the polysilicon film 113, the first silicon particles 114 and the second silicon particles 115 are not limited to these materials but required to have electric conductivity, the material being exemplified by a semiconductor of germanium, gallium arsenide or the like or a metal of aluminum, copper, silver, gold or the like. Moreover, the materials of the silicon oxide films 112 and 112B are not limited to these materials but required to be an electrically insulating material such as a silicon nitride film, a laminate film of a silicon oxide film and a silicon nitride film, a metal oxide film or the like. The silicon oxide film 112 placed between the silicon substrate 111 and the polysilicon film 113 should preferably have a thickness of, for example, 1 nm to 6 nm. The polysilicon film 113 should preferably have a thickness of, for example, 0.5 nm to 10 nm. The first silicon particles 114 and the second silicon particles 115 should preferably have a diameter of, for example, 2 nm to 10 nm. However, the above numerical ranges are not limitative. However, if the thickness of the silicon oxide film 112 placed between the silicon substrate 111 and the polysilicon film 113 is excessively thin, then the probability of the penetration of electric charges through the silicon oxide film due to the tunneling phenomenon is increased to reduce the storage retention time. If the thickness is excessively thick, then the short-channel effect is enhanced, making it difficult to miniaturize the element. Therefore, it is more preferable to set the thickness to 2 nm to 5 nm. Furthermore, if the diameters of the first silicon particles 114 and the second silicon particles 115 are excessively small, then the quantum size effect is enhanced, and a high voltage is needed for the movement of electric charges. If the diameter is excessively large, then the short-channel effect is enhanced, making it difficult to miniaturize the element. Therefore, it is preferable to set the diameter to 3 nm to 7 nm.

A thickness W of the silicon oxide film containing the silicon particles (i.e., a distance from an interface between the electrode polysilicon film 116 and the silicon oxide film 112B containing the silicon particles to an interface between the polysilicon film 113 and the silicon oxide film 112B containing the silicon particles) should preferably satisfy the following expression.

$$W \leq 2H + S_1 \qquad (1)$$

In this case, H represents the average diameter or the average height of the silicon particles, and $S_1$ represents the thickness of the silicon oxide film that separates the first silicon particles 114 from the polysilicon film 113. As an example, if H is 5 nm and $S_1$ is 2 nm, then W becomes equal to or smaller than 12 nm according to the expression (1). The equation (1) is satisfied when a greater number of second silicon particles 115 are located obliquely above the first silicon particles 114. By satisfying the expression (1), the effective thickness of the memory film 130 or 130' can be reduced, and the electrostatic capacity of the memory film 130 can be increased.

In this case, in order to evaluate the average diameter or the average height H of the silicon particles, it is proper to use a cross-sectional TEM (transmission electron microscope) photograph that bears images of about ten or more silicon particles and to average the diameters or heights of the silicon particles pictured in this cross-sectional TEM photograph. Moreover, when the unevenness of the interface between the electrode polysilicon film 116 and the oxide film 112B is serious in evaluating the thickness W of the silicon oxide film 112B containing the silicon particles, its average value $W_{AV}$ is used. In order to obtain the average value $W_{AV}$, it is proper to use a cross-sectional TEM photograph that bears the images of about ten or more silicon particles and to adopt the average film thickness in this cross-sectional TEM photograph. The aforementioned analysis was executed by using the cross-sectional TEM photograph of the memory film 130 or 130' formed according to the aforementioned embodiment. Consequently, the average H of the heights of the silicon particles was 5 nm, the thickness $S_1$ of the silicon dioxide film that separates the first silicon particles 114 from the polysilicon film 113 was 2 nm, and the thickness $W_{AV}$ of the silicon oxide film 112B containing the silicon particles was 8 nm, satisfying the expression (1).

According to the memory film manufacturing method of the present embodiment, there is needed no control of the positions of the formation of the silicon particles, and the memory film can be formed by repeating the thermal oxidation process and the LPCVD process. However, it is possible to accurately control the oxide film thicknesses S1, S2 and S3 for separating the nodes (polysilicon film 113, first silicon particles 114, second silicon particles 115 and electrode polysilicon film 116). Therefore, a memory film of stable electrical characteristics can be formed through simple processes.

Furthermore, according to the measurement of memory characteristics, it was indicated that, for example, write and erase at a voltage of ±3 V and nondestructive read at a voltage of 1 V were possible, and it was discovered that remarkably low voltage operation was possible in comparison with the memory film of the prior art flash memory. Moreover, by virtue of the possible low-voltage operation, the deterioration of the memory film due to high-energy electric charges, which has been a problem in the prior art flash memory, can be restrained, and reliability can be improved.

In the memory film 130 or 130' produced by the present embodiment, the silicon particles 114 and 115 are obliquely arranged, and therefore, it is possible to reduce the thickness of the memory film 130 or 130' and increase the electrostatic capacity. Therefore, when, for example, this memory film 130 or 130' is introduced into the gate insulation film of a field-effect transistor, it is possible to reduce the effective gate insulation film thickness, restrain the short-channel effect and miniaturize the memory element.

SECOND EMBODIMENT

The second embodiment of the present invention will be described with reference to FIGS. 7 through 9. The present embodiment is related to the memory film characteristic when the number of times (three times in the first embodiment) of silicon growth by the LPCVD method is changed in the first embodiment. It is to be noted that the oxidation of the silicon substrate, the oxidation of the polysilicon film and the oxidation of the silicon particles are all carried out by thermal oxidation.

Figure 7:
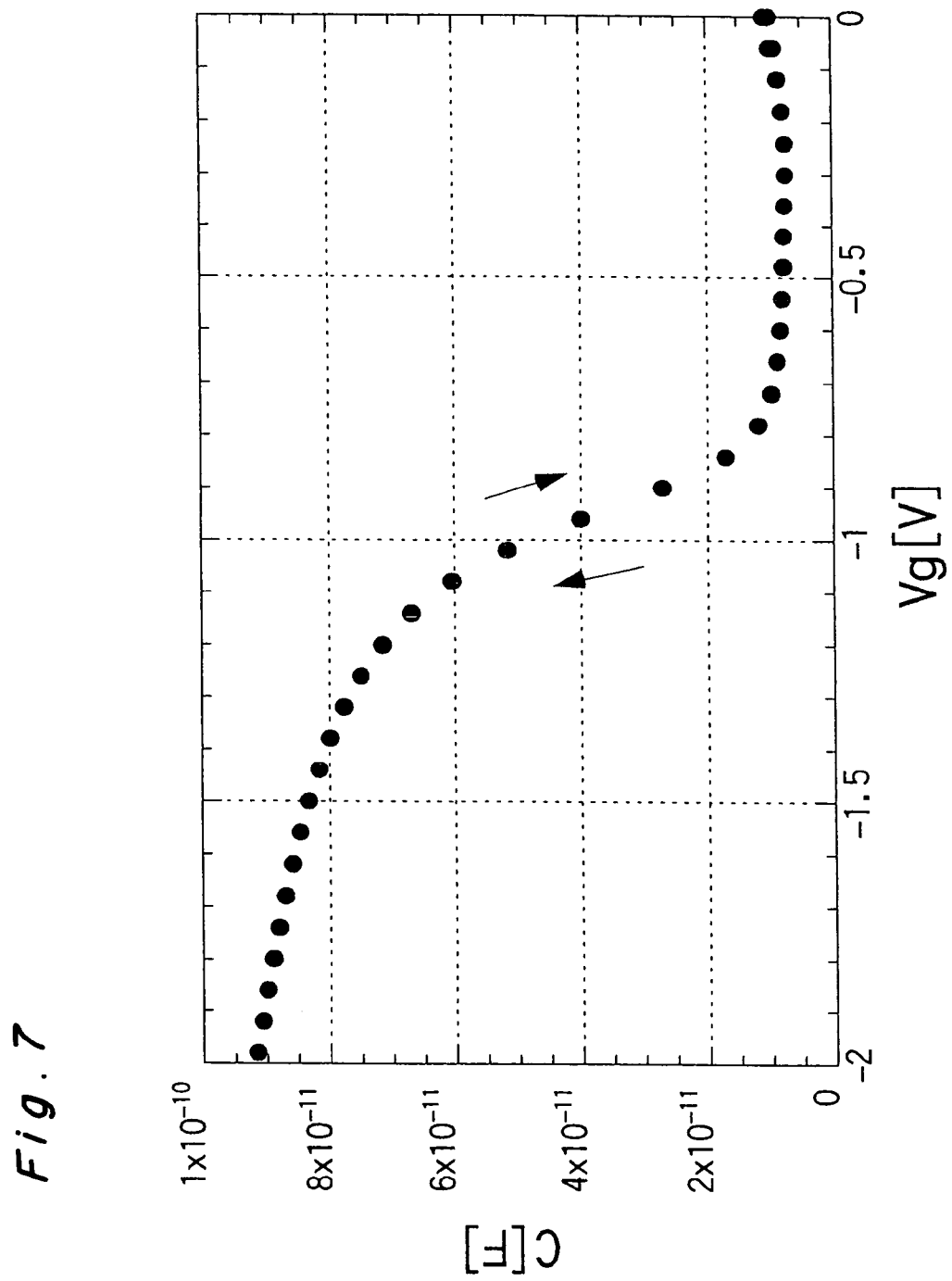
FIG. 7 is a graph showing a change in capacitance when the voltage applied to the memory film is scanned in the case where silicon growth is carried out one time by the LPCVD method in a memory film forming stage.

FIG. 7 is a graph showing the relation between the capacitance and the voltage of the memory film when the silicon growth by the LPCVD method is carried out one time. The potential Vg of the electrode polysilicon film with respect to the silicon substrate was scanned from +3 V to −3 V and thereafter scanned again to +3 V. The memory effect does not appear at all. At this time, the memory film had a structure of electrode polysilicon film/oxide film/polysilicon film/oxide film/silicon substrate.

Figure 8:
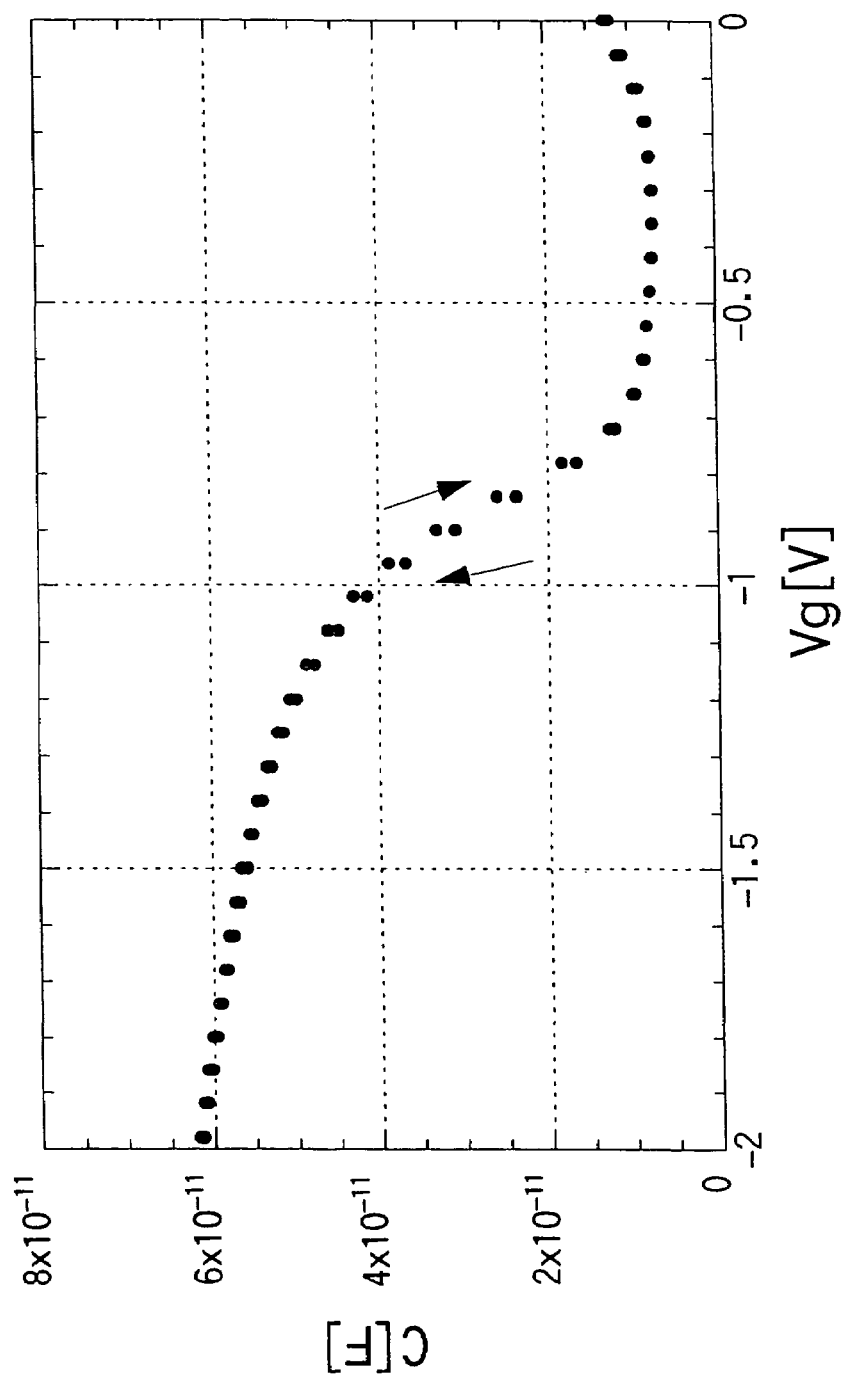
FIG. 8 is a graph showing a change in capacitance when the voltage applied to the memory film is scanned in the case where silicon growth is carried out two times by the LPCVD method in a memory film forming stage.

FIG. 8 is a graph showing the relation between the capacitance and the voltage of the memory film when the silicon growth by the LPCVD method is carried out two times. Hysteresis appears, and the memory effect is confirmed. At this time, the memory film had a structure in which the second silicon particles 115 in FIG. 5 did not exist, and the thickness of the silicon oxide film 112B containing the silicon particles was reduced by that much.

Figure 9:
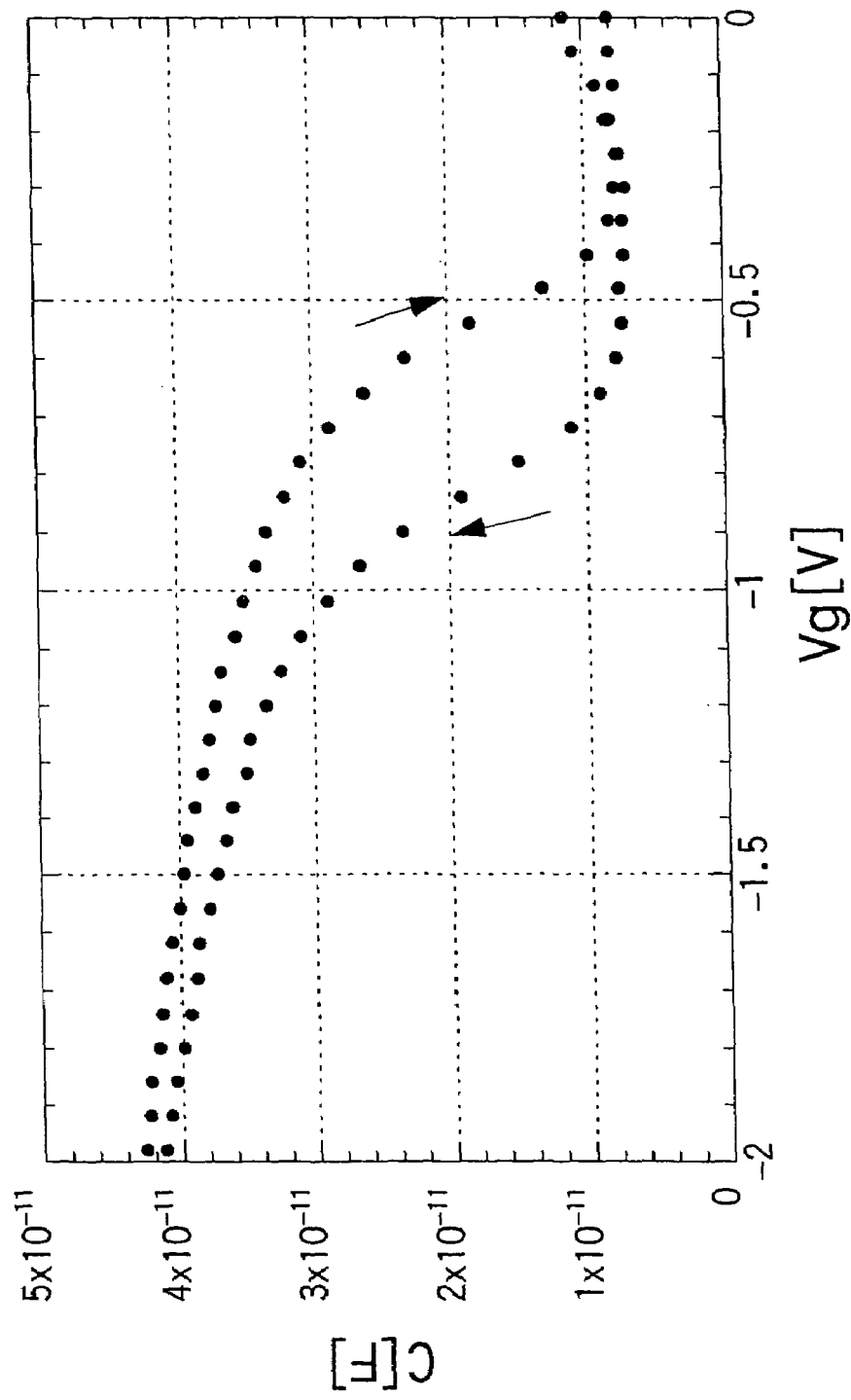
FIG. 9 is a graph showing a change in capacitance when the voltage applied to the memory film is scanned in the case where silicon growth is carried out three times by the LPCVD method in a memory film forming stage.

FIG. 9 is a graph showing the relation between the capacitance and the voltage of the memory film when the silicon growth by the LPCVD method is carried out three times. The memory effect was very remarkable in comparison with FIG. 8. Although not shown, the characteristic when the silicon growth by the LPCVD method was carried out four times was very close to the characteristic when the silicon growth was carried out three times.

For the above reasons, it was discovered that the silicon growth by the LPCVD method was required to be carried out at least two times and should more preferably be carried out three or more times. If the silicon growth is carried out five or more times, then the effective film thickness of the memory film becomes thicker (electrostatic capacity is reduced). When this memory film is introduced into the gate insulation film of a field-effect transistor, control of the short-channel effect becomes difficult and the miniaturization of the memory element becomes difficult when the effective film thickness of the memory film is thick. Therefore, it is most preferable to carry out the silicon growth by the LPCVD method three to four times. A polysilicon film is formed at the first time of the silicon growth by the LPCVD method. Therefore, the silicon growth by the LPCVD method for forming the silicon particles is required to be carried out at least one time, and it is most preferable to carry out the silicon growth two to three times.

THIRD EMBODIMENT

The third embodiment of the present invention will be described with reference to FIGS. 10A through 10C. The present embodiment is related to another method for forming a memory film in the same form as that of the memory film of the first embodiment.

Figure 10A:
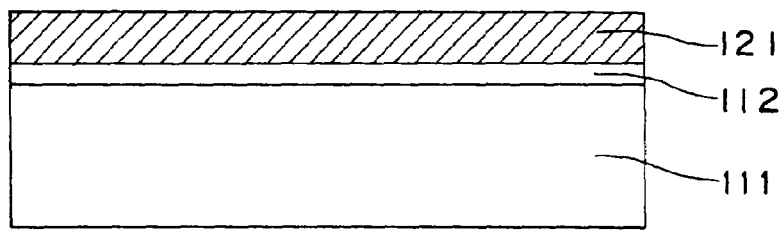
FIGS. 10A through 10C are views showing a memory film manufacturing method according to a third embodiment of the present invention.
Figure 10B:
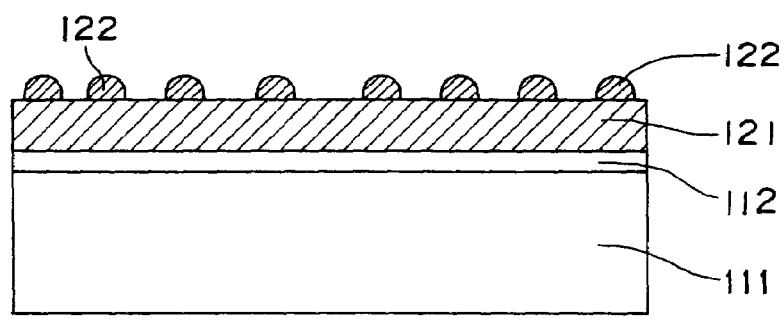
Figure 10C:
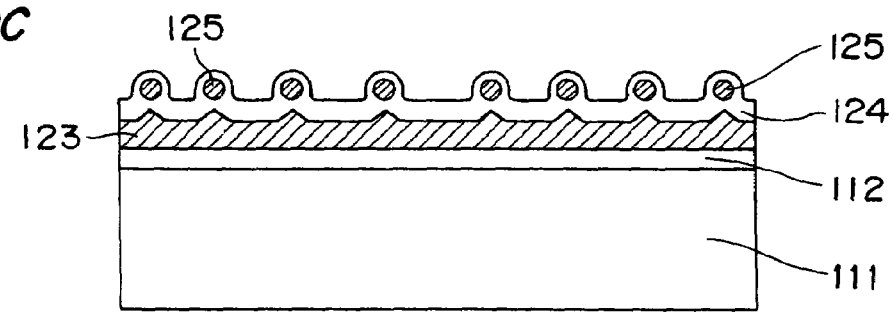

FIGS. 10A through 10C are views showing another manufacturing procedure for forming a memory film in the same form as that of the memory film 130 shown in FIG. 5. First of all, a silicon oxide film 112 of a thickness of 2 nm was formed on a silicon substrate 111 in an $N_2O$ atmosphere at a temperature of 900° C. It is to be noted that the CVD method can be used for the formation of this silicon oxide film 112. However, when a field-effect transistor is formed its gate oxide film is made preferably by the thermal oxidation method having a little dencity of surface state.

Subsequently, an amorphous silicon film 121 of a thickness of 6 nm was formed on the above-mentioned base by the molecular beam epitaxy method (MBE method) or the LPCVD method (FIG. 10A). Subsequently, there exists a method for cleaning the surface by hydrofluoric acid, thereafter putting the resulting laminate into an ultra-high vacuum CVD apparatus and supplying $Si_2H_6$ (first method) and a method for forming an amorphous silicon film and thereafter supplying $Si_2H_6$ without exposure to atmosphere (second method).

Reference is first made to the first method. After the formation of the amorphous silicon film 121, the substrate in the state was immersed in a cleaning solution (60° C.) in which $NH_4OH$, $H_2O_2$ and $H_2O$ are mixed at a ratio of 1:6:20 to remove the contaminant on the surface and immersed in a 5% hydrofluoric acid solution for 30 seconds to remove the naturally formed oxide film. Subsequently, the substrate in the state was dried by a centrifugal separator or dry nitrogen gas and put into a formation chamber of the ultra-high vacuum CVD apparatus provided with a nozzle for $Si_2H_6$ supply and a substrate heating device of a graphite heater. The degree of vacuum in the formation chamber is maintained at a pressure of $10^{-9}$ Torr. First of all, substrate heating was carried out at a certain constant temperature or preferably at a low temperature of 500° C. to 620° C. at which no nucleus formation rapidly occurs only by heating, and thereafter $Si_2H_6$ for nucleus formation was applied at a flow rate of 13 cccm. Consequently, a crystalline nucleus 122 was generated on the surface of the amorphous silicon film 121 (FIG. 10B). At this time, the position where the crystalline nucleus 122 was formed was substantially random in a plane along the surface of the amorphous silicon film 121. The formation density of the crystalline nucleus was increased almost in proportion to the time of exposure to $Si_2H_6$. At this time, the diameter of the crystalline nucleus was almost constant regardless of the time of exposure to $Si_2H_6$. After exposure to the $Si_2H_6$ gas for a specified time, heating was continued with a high vacuum provided to carry out the growth of the crystalline nucleus 122. It is to be noted that the heating in this high vacuum, for the adjustment of the size of the crystalline nucleus, can be omitted. Moreover, with regard to the exposure to $Si_2H_6$, it is acceptable to use an $SiH_4$ gas or a mixture of the $Si_2H_6$ gas and the $SiH_4$ gas. Subsequently, a thermal oxidation process was carried out as described later.

Reference is next made to the second method. After the formation of the amorphous silicon film 121, the substrate temperature was set to 500° C. to 620° C. without exposure to atmosphere, and thereafter, the $Si_2H_6$ for nucleus formation was applied at a flow rate of 13 cccm. Consequently, a crystalline nucleus 122 was generated on the surface of the amorphous silicon film 121 similarly to the case of the first method (FIG. 10B). The formation density of the crystalline nucleus was increased almost in proportion to the time of exposure to $Si_2H_6$. At this time, the diameter of the crystalline nucleus was almost constant regardless of the time of exposure to $Si_2H_6$. After exposure to the $Si_2H_6$ gas for a specified time, heating was continued with a high vacuum provided to carry out the growth of the crystalline nucleus 122. It is to be noted that the heating in this high vacuum, for the adjustment of the size of the crystalline nucleus, can be omitted. Moreover, with regard to the exposure to $Si_2H_6$, it is acceptable to use an $SiH_4$ gas or a mixture of the $Si_2H_6$ gas and the $SiH_4$ gas. Subsequently, a thermal oxidation process was carried out as described later.

After carrying out the process described in connection with the first method or the second method, thermal oxidation was carried out in an $N_2O$ atmosphere at a temperature of 900° C. As a result, part of the amorphous silicon film 121 and part of the crystalline nucleus 122 were oxidized and became a silicon oxide film 124. Moreover, part of the amorphous silicon film 121 was not oxidized and became a polysilicon film 123. Further, the core portion of the crystalline nucleus 122 was not oxidized and became a first silicon particle 125.

The subsequent procedure is the same as the procedure subsequent to the second silicon particle forming process of the first embodiment. Thus, a memory film in the same form as that of the memory film 130 shown in FIG. 5 was able to be formed by the aforementioned method.

The memory film manufacturing method of the present embodiment does not need the formation position control of the silicon particles at all and the memory film is able to be formed by repeating the thermal oxidation process and the LPCVD process or the MBE process. However, it is possible to accurately control the thickness of each of the oxide films for separating the nodes (polysilicon film 123, first silicon particles 125, second silicon particles and electrode polysilicon film). Therefore, a memory film of stable electrical characteristics can be formed through simple processes.

Moreover, according to the memory film manufacturing method of the present embodiment, the formation density of the silicon particles can be controlled by merely changing the time of supply of $Si_2H_6$. Therefore, it is easy to control the characteristics of the memory film.

FOURTH EMBODIMENT

The fourth embodiment of the present invention will be described with reference to FIGS. 11 and 12. The memory element of the present embodiment is constituted by incorporating the memory film 130 or 130' of the first embodiment into the gate insulation film of a field-effect transistor.

Figure 11:
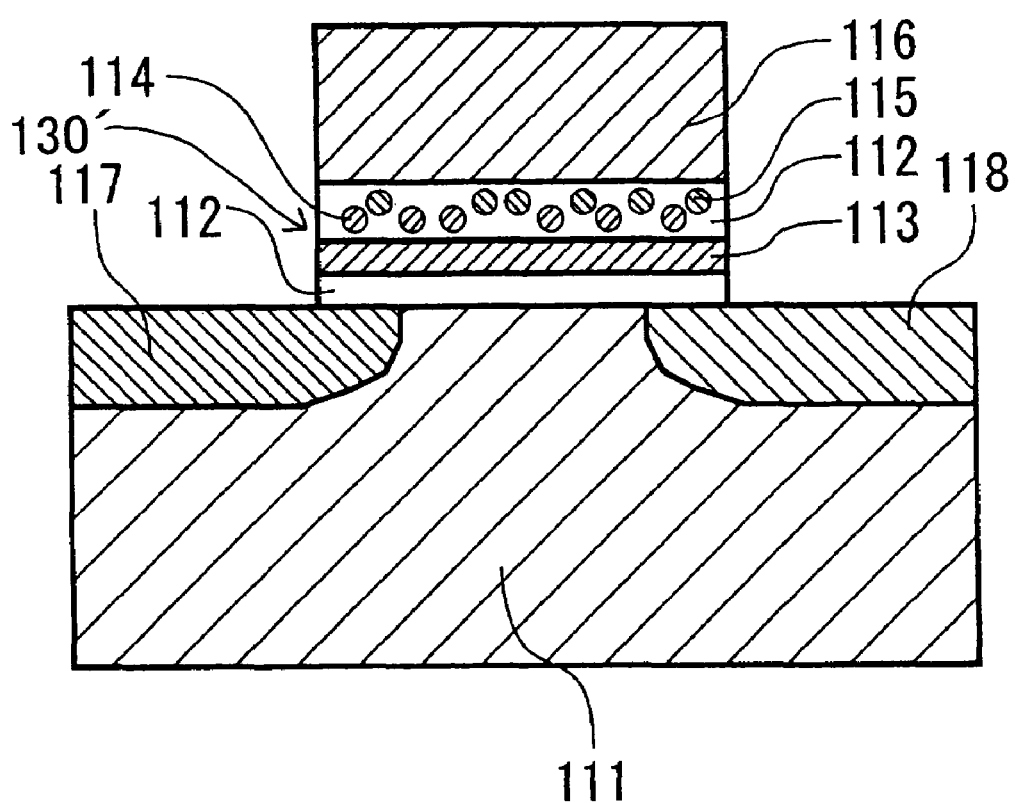
FIG. 11 is a sectional view of a memory element according to a fourth embodiment of the present invention.
Figure 12:
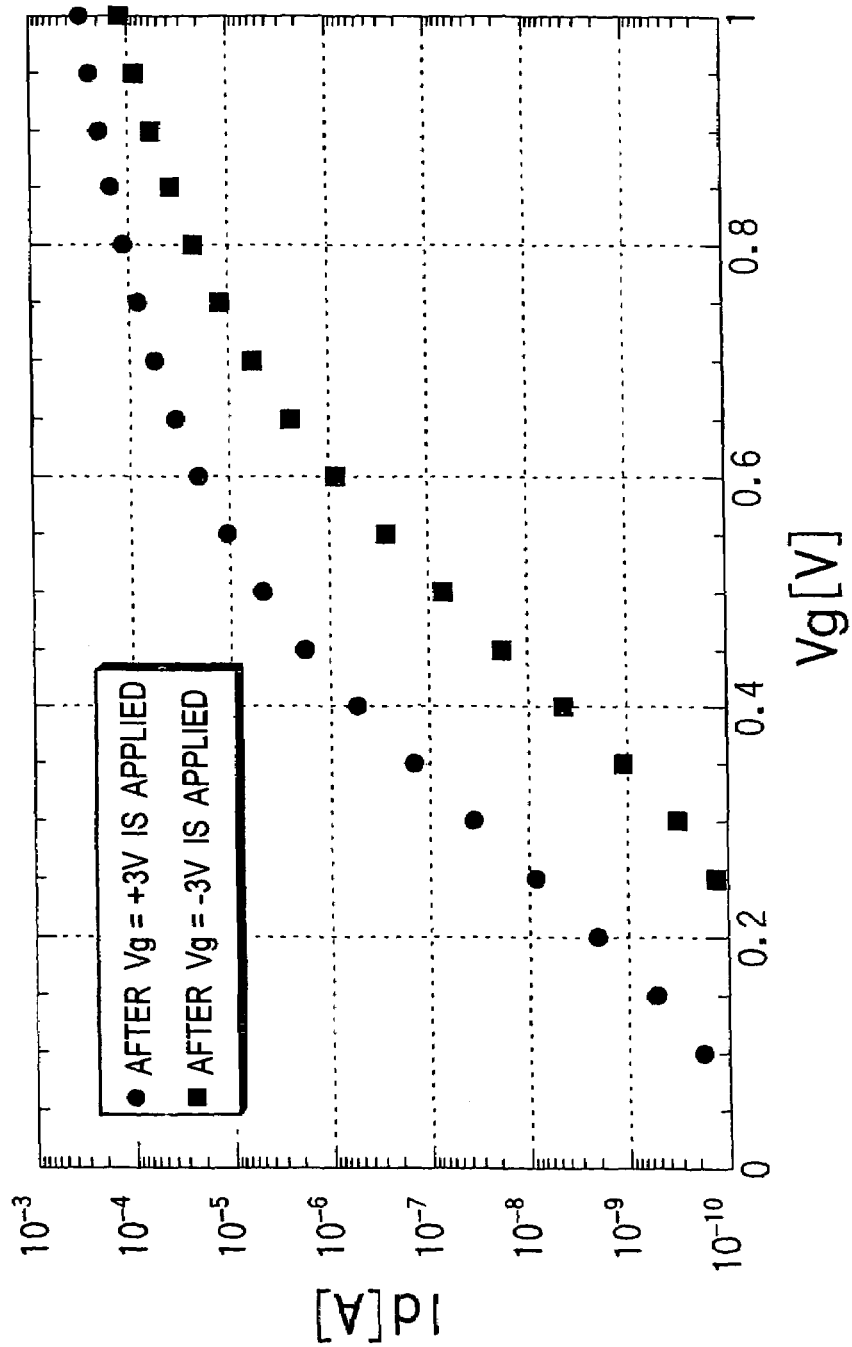
FIG. 12 is a graph showing a relation of a drain current to a gate voltage during write and erase in the memory element of the fourth embodiment of the present invention.

FIG. 11 is a sectional view of the memory element of the present embodiment. An electrode polysilicon 116 (gate electrode) is formed on a silicon substrate 111 via the memory film 130' shown in FIG. 6. Moreover, a source region 117 and a drain region 118 are formed.

In the present embodiment, the silicon substrate 111 has a P-type conductive type, while the gate electrode, the source region and the drain region have the N-type conductive type, constituting an N-channel type field-effect transistor. However, the present invention is not limited to this, and the transistor may be a P-channel type field-effect transistor (having an N-type silicon substrate and P-type source and drain regions). The gate electrode is not limited to polysilicon and is allowed to be a metal. Moreover, although the memory element shown in FIG. 11 employs the memory film 130' shown in FIG. 6, it is acceptable to employ the memory film 130 shown in FIG. 5.

The memory element of the present embodiment employs the memory film 130 or 130' of the first embodiment, and therefore, the effective thickness of the gate insulation film can be reduced. Therefore, it is possible to restrain the short-channel effect and miniaturize the element.

Furthermore, the memory element of the present embodiment employs the memory film 130 or 130' of the first embodiment, and therefore, it is possible to execute write and erase and nondestructive read at low voltages. In concrete, when the amount of oxidation of the polysilicon film 113 is 2 nm, it is possible to execute write and erase at a voltage of ±3 V and nondestructive read at a voltage of 1 V. Moreover, when the amount of oxidation of the polysilicon film 113 is 1.5 nm, it is possible to execute write and erase at a voltage of ±1.5 V and nondestructive read at a voltage of 0.5 V. Therefore, low-voltage operation is possible, and this allows the achievement of low power consumption and the improvement of the reliability of the element.

The procedure for manufacturing the memory element of the present embodiment is almost the same as the well-known procedure for producing a field-effect transistor. A difference from the well-known procedure resides only in the formation of the memory film, and the procedure for forming the memory film is as described in connection with any one of the first through third embodiments.

According to the manufacturing procedure of the first or second embodiment, the thermal oxidation process and the LPCVD process are merely repeated four times and three times, respectively, in forming the memory film portion, and no control of the formation positions of the silicon particles is needed. However, it is possible to accurately control each of the oxide film thickness $S_1$ for separating the polysilicon film 113 from the first silicon particles 114, the oxide film thickness $S_2$ for separating the first silicon particles 114 from the second silicon particles 115 and the oxide film thickness $S_3$ for separating the second silicon particles 115 from the electrode polysilicon film 116. Therefore, it is possible to form a memory element of stable electrical characteristics through simple processes.

According to the manufacturing procedure of the third embodiment, no control of the formation positions of the silicon particles is needed, and the memory film can be formed by repeating the thermal oxidation process and the LPCVD process or the MBE process. However, it is possible to accurately control the thickness of each of the oxide films for separating the nodes (polysilicon film 123, first silicon particles 125, second silicon particles and electrode polysilicon film). Therefore, a memory film of stable electrical characteristics can be formed through simple processes.

Moreover, according to the manufacturing procedure of the third embodiment, the formation density of the silicon particles can be controlled by merely changing the time of supply of $Si_2H_6$. Therefore, it is easy to control the characteristics of the memory film.

The characteristics of the memory element produced according to the aforementioned procedure are shown next. FIG. 12 is a graph showing the relation between the drain current (Id) and the gate voltage (Vg) of the memory element. It is discovered that the threshold rose (write) after the application of a voltage of −3 V to the gate electrode, indicating the memory effect. On the other hand, it was discovered that the threshold is lowered when a voltage of +3 V was applied to the gate electrode, indicating that erase was executed.

Since the memory element of the present embodiment employs the memory film 130 or 130' of the first embodiment, the effective thickness of the gate insulation film can be reduced. Therefore, it is possible to restrain the short-channel effect and miniaturize the element.

Furthermore, since the memory element of the present embodiment employs the memory film 130 or 130' of the first embodiment, it is possible to execute write and erase at a voltage of ±3 V and nondestructive read at a voltage of 1 V. Therefore, remarkably low voltage operation is possible in comparison with the prior art flash memory, and this allows the achievement of low power consumption and the improvement of the reliability of the element.

Since the memory element of the present embodiment is required to use the procedure shown in connection with the first or second embodiment when forming the memory film, there is needed no control of the formation positions of the silicon particles, and the memory film can be formed by repeating the thermal oxidation process and the LPCVD process (or the MBE process). However, it is possible to accurately control the thickness of each of the oxide films for separating the nodes (polysilicon film, first silicon particles, second silicon particles and electrode polysilicon film). Therefore, a memory film of stable electrical characteristics can be formed through simple processes.

FIFTH EMBODIMENT

Figure 13:
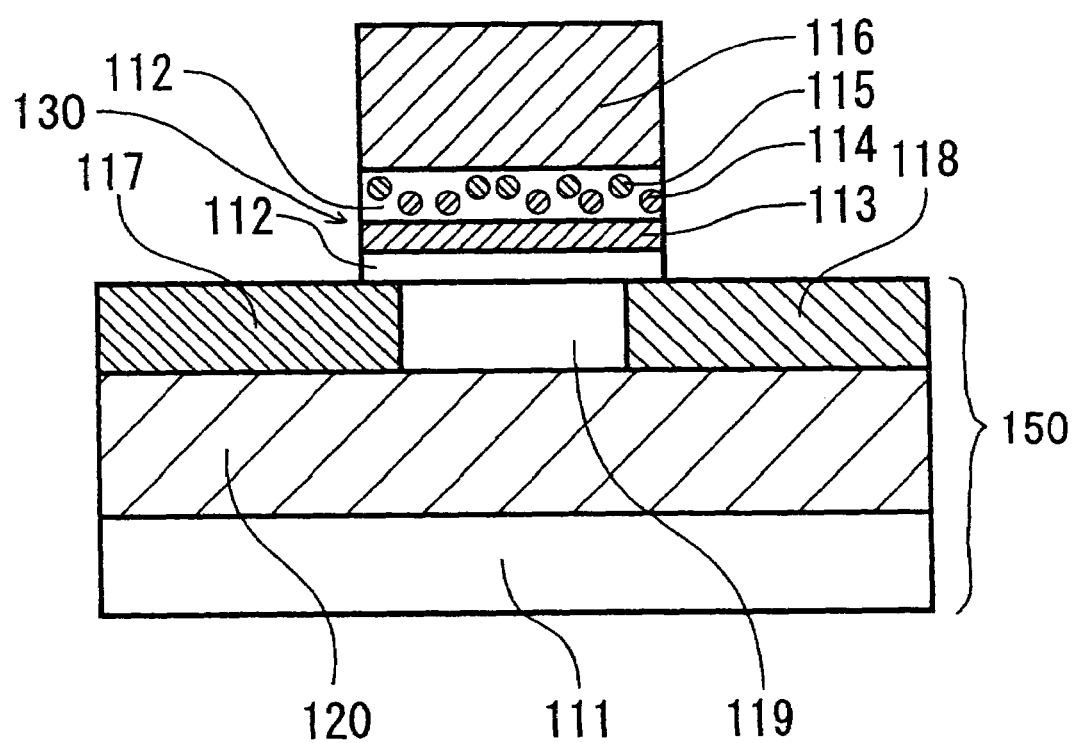
FIG. 13 is a sectional view of a memory element according to a fifth embodiment of the present invention.

The fifth embodiment of the present invention will be described with reference to FIG. 13. The memory element of the present embodiment is obtained by forming the memory element of the fourth embodiment on a SOI (Silicon on Insulator) substrate 150. FIG. 13 is a sectional view of a memory element of the semiconductor device of the present embodiment. The reference numeral 119 denotes a body, and 120 denotes an embedded oxide film. Although the memory element shown in FIG. 13 employs the memory film 130' shown in FIG. 6, it is acceptable to employ the memory film 130 shown in FIG. 5. Although FIG. 13 shows the complete depletion type, there may be a partial depletion type.

The procedure for manufacturing the memory element of the present embodiment is almost the same as the well-known procedure for producing a field-effect transistor on a SOI substrate. A difference from the well-known procedure resides only in the formation of the memory film, and the procedure for forming the memory film is as described in connection with any one of the first through third embodiments.

In the semiconductor device of the present embodiment, the following effects are obtained in addition to the effects obtained by the memory element of the fourth embodiment. In the memory element of the present embodiment, a junction capacitance between the source region 117 and the drain region 118 and the body 119 can be remarkably reduced. Furthermore, by employing the SOI substrate, it is easy to shallow the depth of the source region 117 and the drain region 118, restraining the short-channel effect and further miniaturizing the element.

SIXTH EMBODIMENT

The sixth embodiment of the present invention will be described below with reference to FIGS. 14 through 18.

Figure 14:
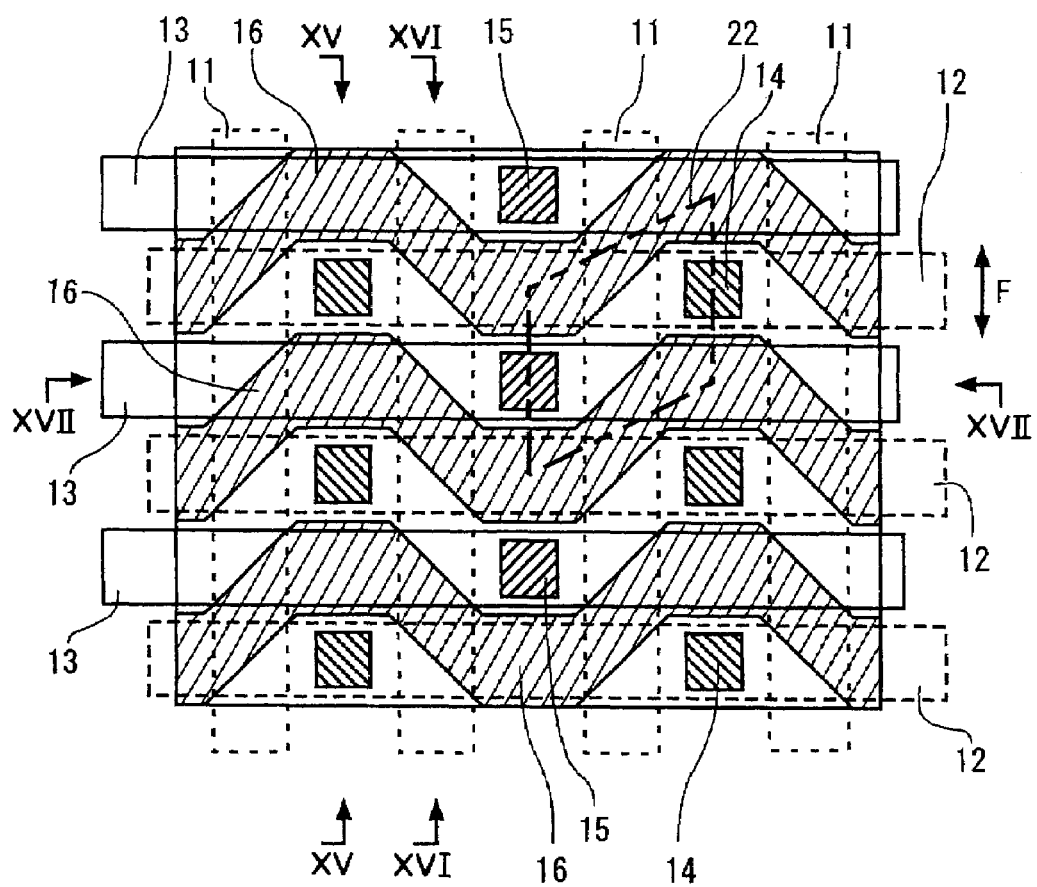
FIG. 14 is a plan view of a memory cell array according to a sixth embodiment of the present invention.
Figure 15:
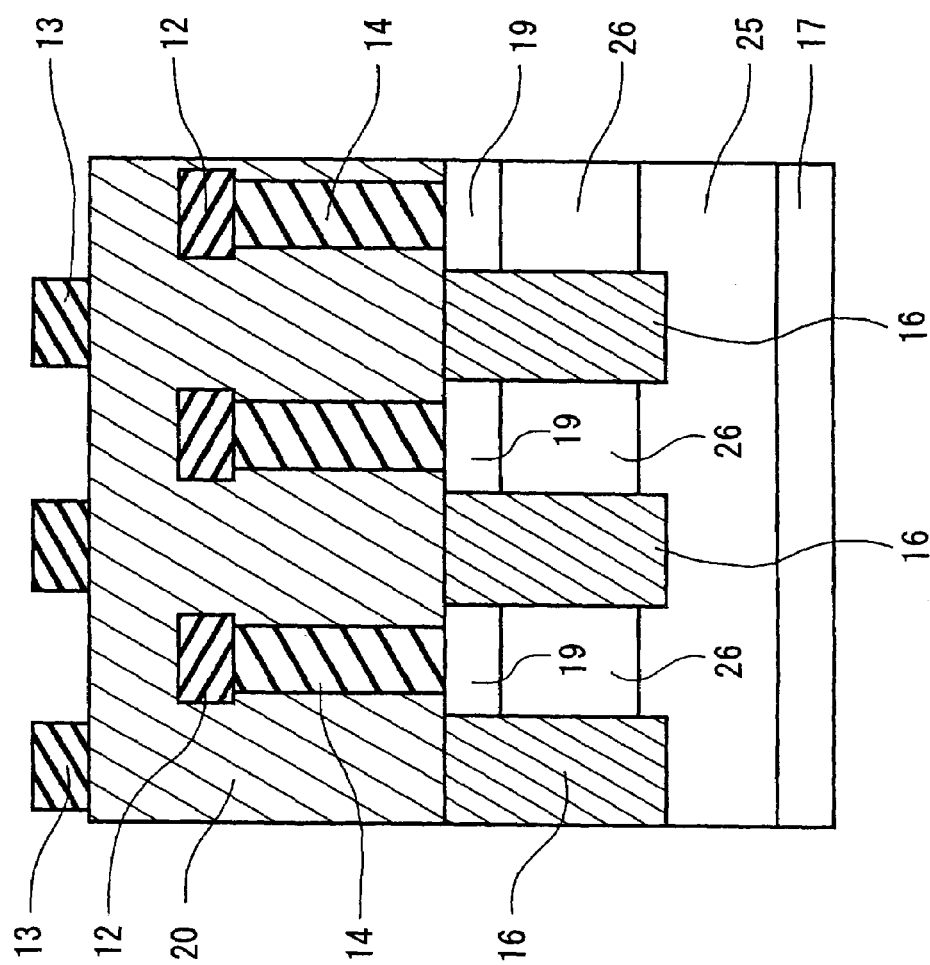
FIG. 15 is a sectional view taken along the sectional line XV—XV in FIG. 14.
Figure 16:
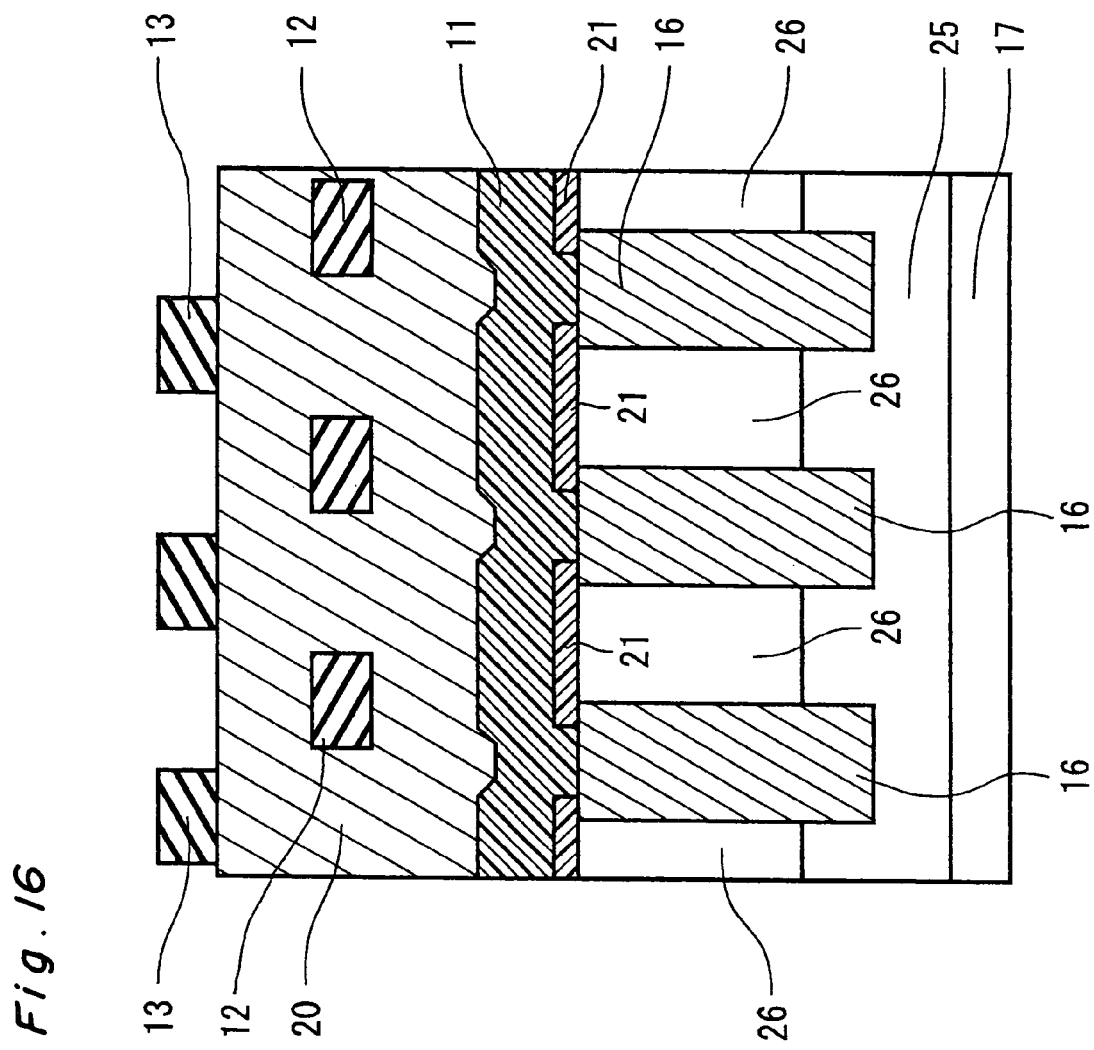
FIG. 16 is a sectional view taken along the sectional line XVI—XVI in FIG. 14.
Figure 17:
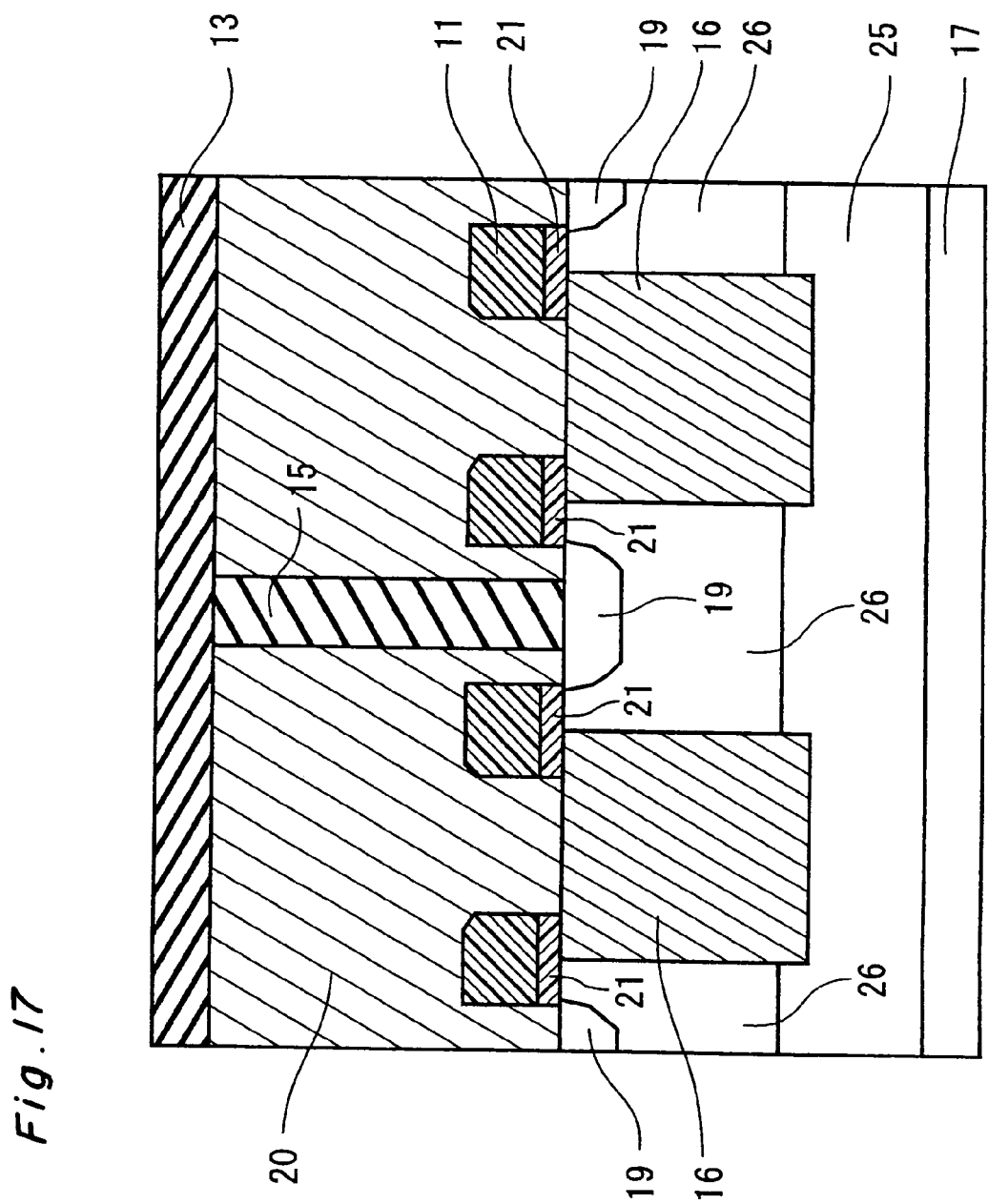
FIG. 17 is a sectional view taken along the sectional line XVII—XVII in FIG. 14.
Figure 18:
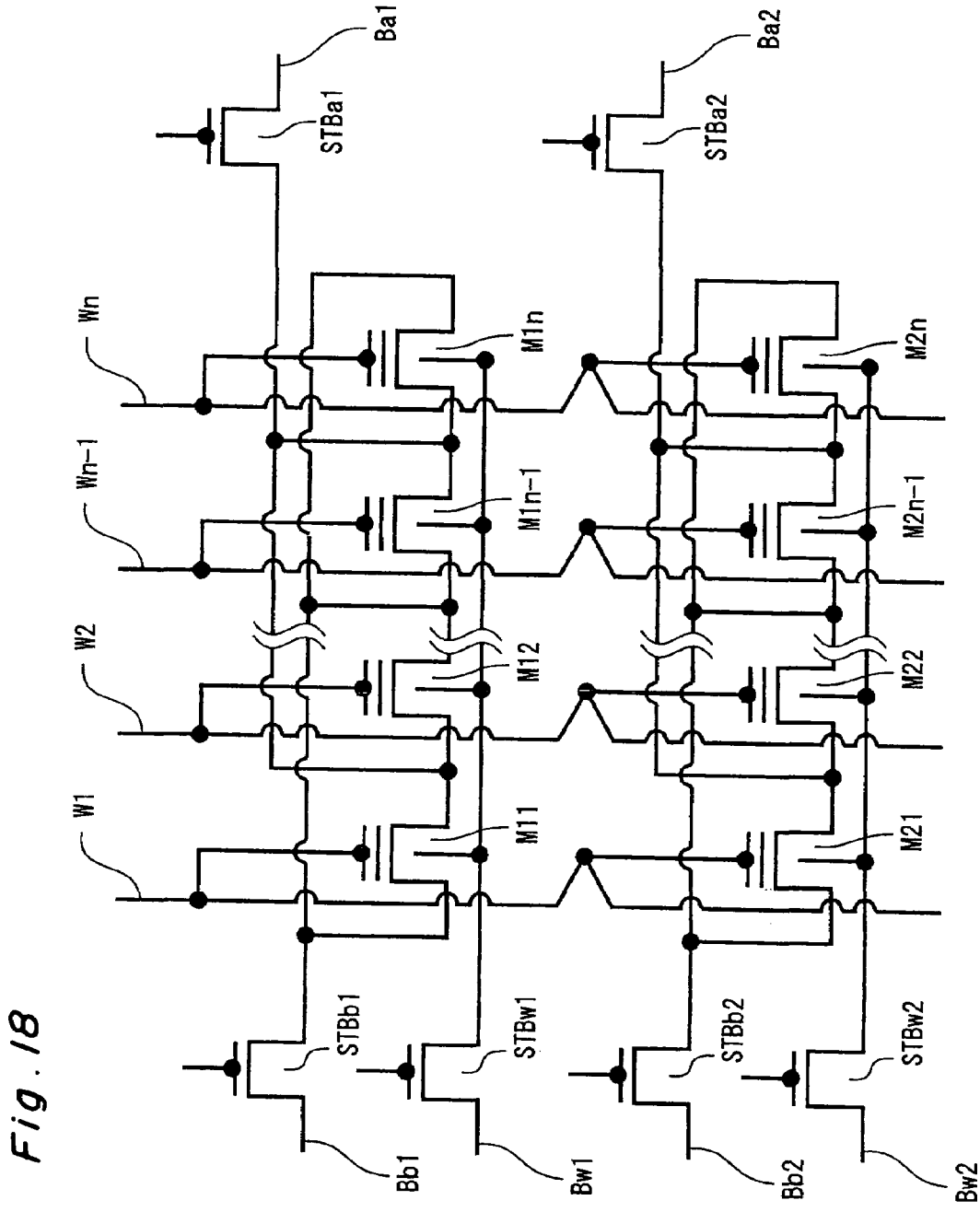
FIG. 18 is a circuit diagram of the memory cell array of the sixth embodiment of the present invention.

FIGS. 14 through 17 are schematic views of the memory cell array of the sixth embodiment of the present invention. FIG. 14 is a planar schematic view. FIG. 15 is a sectional view taken along the sectional line XV—XV in FIG. 14. FIG. 16 is a sectional view taken along the sectional line XVI—XVI in FIG. 14, and FIG. 17 is a sectional view taken along the sectional line XVII—XVII in FIG. 14. FIG. 18 is a circuit diagram of the memory cell array.

The construction of the semiconductor device of the present embodiment will be described first with reference to FIGS. 14 through 17. As apparent from FIGS. 15 through 17, an N-type deep well region 25 and a P-type shallow well region 26 are formed in a silicon substrate 17. Further, a plurality of element isolation regions 16 are formed so as to extend meandering in the transverse direction in FIG. 14 (the meandering belt-shaped regions are each indicated by hatching in FIG. 14). The pitch in the longitudinal direction of the element isolation regions 16 is set to 2F (F is a minimum processing pitch). With this arrangement, there remain silicon active regions that extend meandering in the transverse direction between adjoining element isolation regions 16 in the upper portions of the well region 26. The depth of the element isolation region 16 is set so that the P-type shallow well regions 26 located on both sides with interposition of the element isolation region 16 are electrically mutually isolated.

As apparent collectively from FIG. 14 through FIG. 17, N⁺ diffusion layers 19 are formed as impurity diffusion regions in each turn portion of the meander inside each of the silicon active regions. Each of the N⁺ diffusion layers 19 operates as a source region or a drain region according to selection by the bit line when this memory is used. At the above-mentioned time, each of the regions located between mutually adjacent N⁺ diffusion layers 19 in an identical active region becomes a channel region.

A plurality of word lines 11 made of polysilicon are formed so as to straightly extend in a direction (longitudinal direction in FIG. 14) perpendicular to the direction in which the element isolation regions 16 extend. The pitch in the transverse direction of the word lines 11 is set to 2F. The silicon active regions (upper portions of the well regions 26) covered with the word lines 11 become channel regions. The channel regions and the word lines 11 are separated from each other by a memory film 21 of the same construction as that of the memory film shown in FIG. 5 or 6 of the first embodiment. The word lines 11 become control gates on the channel regions.

A plurality of bit lines 12 constructed of a first layer metal are formed so as to straightly extend in the direction (transverse direction in FIG. 14) perpendicular to the word lines 11. The pitch in the longitudinal direction of the first bit lines 12 is set to 2F, and the bit lines are provided so as to extend over the N⁺ diffusion layers 19 provided in the turn portions on one side (hill side in FIG. 14) of the meander in an identical silicon active region. These first bit lines 12 and the N⁺ diffusion layers 19 existing just below the bit lines are connected together by first bit line contacts 14 at a pitch of 4F in the transverse direction. Moreover, a plurality of second bit lines 13 constructed of a second layer metal are formed in positions interposed between the first bit lines in the same direction as that of the first bit lines 12 so as to straightly extend parallel to the first bit lines. The pitch in the longitudinal direction of the second bit lines 13 is set to 2F, and the bit lines are provided so as to extend over the N⁺ diffusion layers 19 provided in the turn portions on the other side (valley side in FIG. 14) of the meander in an identical silicon active region. These second bit lines 13 and the N⁺ diffusion layers 19 located just below the bit lines are connected together by second bit line contacts 15 at a pitch of 4F in the transverse direction. The first and second bit lines 12 and 13 are mutually separated by a layer insulation film 20 and connected to the N⁺ diffusion layers 19 via the contacts 14 and 15 at the required portions as described above. Moreover, the P-type shallow well region 26 with respect to the silicon substrate is segmented by the element isolation regions 16 into thin lines extended in the same direction as that of the first bit lines and the second bit lines, constituting third bit lines.

According to the above-mentioned construction, one memory cell is defined by a parallelogram 22 indicated by the two-dot chain lines in FIG. 14, and its area is 4F².

It is to be noted that the memory film 21 is a film constructed of the silicon oxide film 112, the silicon oxide film 112B, the polysilicon film 113, the first silicon particles 114 and the second silicon particles 115 in FIG. 5 or 6.

The circuit construction of the memory cell array of the present embodiment will be described next with reference to FIG. 18. This memory cell array is arranged in the so-called AND type. That is, one first bit line and one second bit line constitute one pair, and n memory cells are connected parallel between these bit lines. In FIG. 18, for example, the first bit line of the first bit line pair is denoted by Ba1, and the second bit line of the first bit line pair is denoted by Bb1. Moreover, for example, the n-th memory cell connected to the first bit line pair is denoted by M1n. Each bit line is provided with a select transistor. In FIG. 18, for example, the first bit line select transistor of the first bit line pair is denoted by STBa1. The feature of the memory cell array of the present embodiment resides in that the P-type shallow well region constitutes the third bit line. This third bit line is connected to the shallow well region of the memory cell connected parallel to a pair of bit lines constructed of the first bit line and the second bit line. The select transistor is connected to this third bit line. In FIG. 18, for example, the first third bit line is denoted by Bw1, and the select transistor corresponding to it is denoted by STBw1. Moreover, n word lines extend perpendicularly to the bit lines, providing connection between the gates of the memory cells. In FIG. 18, the word lines are denoted by W1 through Wn.

The procedure for producing the memory cell array of the present embodiment will be described next.

First of all, electrically insulative element isolation regions 16 are formed in the silicon substrate 17 shown in FIGS. 15 through 17, and an N-type deep well region 25 and P-type shallow well regions 26 are subsequently formed. The depth of a junction of the N-type deep well region and the P-type shallow well regions is determined depending on impurity injection conditions (injection energy and the quantity of injection) and the subsequent thermal processes (annealing process, thermal oxidation process and so on). These impurity injection conditions, the thermal processing conditions and the depth of the element isolation regions are set so that the element isolation regions 16 electrically isolate the P-type shallow well regions 26.

Subsequently, the memory film 21 is formed according to the procedure described in connection with any one of the first through third embodiments and subjected to pattern processing by photolithography and etching. It is concerned that the polysilicon film in the memory film may be exposed after this pattern processing and short-circuit to the word lines formed later may occur, and therefore, it is preferable to carry out thermal oxidation. Subsequently, the polysilicon film is formed by the chemical vapor deposition method (CVD method). This polysilicon film and the memory film 21 are subjected to pattern processing by photolithography and etching, and the word lines 11 are formed. In this case, if an N-type impurity is injected with a low energy using the word lines 11 as a mask, then the $N^+$ diffusion layer 19 is formed in self-alignment. Subsequently, the deposition of an interlayer insulation film, a contact-making process and a metal process are repetitively carried out to form the first bit lines 12 and the second bit lines 13.

The memory cell array of the present embodiment employs the memory film described in connection with any one of the first through third embodiments. Therefore, since the miniaturization of the element is possible, high integration is achieved. Furthermore, since low-voltage driving is possible, low power consumption can be achieved, and the reliability of the memory cell array is improved.

Furthermore, in the memory cell array of the present embodiment, one cell area is $4F^2$, which is smaller than that of the conventional AND type memory cell array (cell area is about $8F^2$). Therefore, high integration is possible, and the yield of the products is improved, allowing the manufacturing cost to be reduced.

Moreover, if the memory of the semiconductor device of the present embodiment, a logic circuit and other memories (DRAM, SRAM and so on) are mounted together, then the degree of integration of the integrated circuit can be improved, and the functions can be improved.

SEVENTH EMBODIMENT

The present embodiment is related to a memory cell array permitting random access, obtained by increasing a ratio of the voltage applied to the memory film of the selected memory cell with respect to the voltage applied to the memory film of the nonselected memory cell as far as possible in the memory cell array of the sixth embodiment.

In general, a maximum voltage is applied to the memory film of the selected memory cell during write or erase of the memory cell. Then, a certain degree of voltage is disadvantageously applied to the memory film of the nonselected memory cell. Therefore, it is preferable to increase the ratio of the voltage applied to the memory film of the selected memory cell with respect to the voltage applied to the memory film of the nonselected memory cell as far as possible in order to prevent malfunction.

According to the method of the general practice, during, for example, erase, the selected word line is made to have a potential of $V_{DD}$, the selected bit line is made to have the ground potential, and other word lines and bit lines are made to have a potential of $V_{DD}/2$. At this time, the voltage $V_{DD}$ is applied to the memory film of the selected memory cell, and the voltage of 0 or $V_{DD}/2$ is applied to the memory film of the nonselected memory cell. At this time, the ratio of the voltage applied to the memory film of the selected memory cell with respect to the maximum value of the voltage applied to the memory film of the nonselected memory cell is ½.

Table 1 shows the voltages applied to the word lines and the bit lines during write and erase in the memory cell array of the present embodiment. Same potential is applied to the bit lines (first through third bit lines). During write, there are the potential 0 applied to the selected word line, $(1-A) \times V_{DD}$ applied to the nonselected word line, $V_{DD}$ applied to the selected bit line and $A \times V_{DD}$ applied to the nonselected bit line. During erase, there are the potential $V_{DD}$ applied to the selected word line, $A \times V_{DD}$ applied to the nonselected word line, the potential 0 applied to the selected bit line and $(1-A) \times V_{DD}$ applied to the nonselected bit line. In this case, $\frac{1}{3} \leq A < \frac{1}{2}$ ($A=\frac{1}{2}$ in the aforementioned example of the general practice). The ratio of the voltage applied to the memory film of the selected memory cell with respect to the maximum value of the voltage applied to the memory film of the nonselected memory cell assumes a maximum value of 3 when $A=\frac{1}{3}$ (in absolute value). Therefore, it is most preferable to provide the setting that $A=\frac{1}{3}$.

TABLE 1

| | During Write | |
| --- | --- | --- |
| | Bit Line | |
| Word Line | (Selected) $V_{DD}$ | (Nonselected) $A \times V_{DD}$ |
| (Selected) 0 | Voltage Applied to Film $-V_{DD}$ | Voltage Applied to Film $-A \times V_{DD}$ |
| (Nonselected) $(1 - A) \times V_{DD}$ | Voltage Applied to Film $-A \times V_{DD}$ | Voltage Applied to Film $(1 - 2A) \times V_{DD}$ |
| | During Erase | |
| | Bit Line | |
| Word Line | (Selected) 0 | (Nonselected) $(1 - A) \times V_{DD}$ |
| (Selected) $V_{DD}$ | Voltage Applied to Film $V_{DD}$ | Voltage Applied to Film $A \times V_{DD}$ |
| (Nonselected) $A \times V_{DD}$ | Voltage Applied to Film $A \times V_{DD}$ | Voltage Applied to Film $(2A - 1) \times V_{DD}$ |

$\frac{1}{3} \leq A < \frac{1}{2}$

By setting the application voltages as described above, it is possible to execute the write operation and the erase operation every one bit, i.e., random access. With regard to the concrete value of $V_{DD}$, it is proper to determine the optimum value for each film quality and film structure. In concrete, there is a practice to cause the injection or discharge of electric charges when the absolute value of the voltage applied to the memory film is $V_{DD}$ and prevent the occurrence of the injection or discharge of electric charges when the absolute value of the voltage applied to the memory film is $A \times V_{DD}$. It is preferable to make the voltage applied to the memory film become equal to or smaller than $A \times V_{DD}$ during read. In the above case, the storage is not damaged by read.

In the memory cell array of the present embodiment, the ratio of the voltage applied to the memory film of the selected memory cell with respect to the maximum value of the voltage applied to the memory film of the nonselected memory cell is large, and random access is possible. This allows the provision of a memory of a great operating margin.

EIGHTH EMBODIMENT

Figure 19:
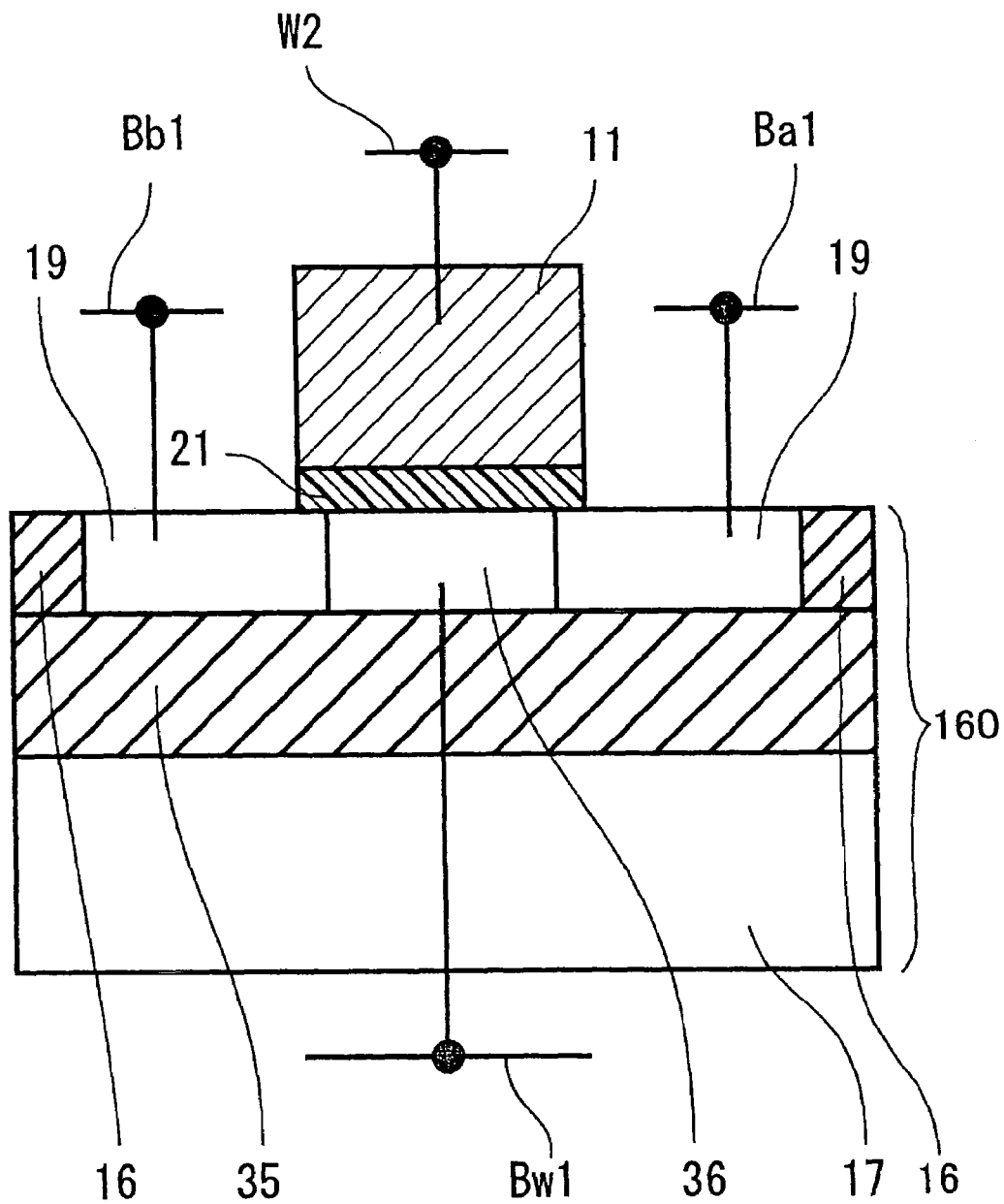
FIG. 19 is a sectional view of the memory cell of a memory cell array according to an eighth embodiment of the present invention.

The eighth embodiment of the present invention will be described below with reference to FIG. 19. The memory cell array of the present embodiment is produced by employing a SOI substrate 160 in the memory cell array of either the sixth or seventh embodiment, and the plan view thereof is the same as that of FIG. 14. There are shown a body 36 and an embedded oxide film 35. FIG. 19 is a schematic view of the cross-section of the memory cell of the memory cell array of the present embodiment. Independent potentials are applied to the array of the bodies 36 separated by the element isolation regions 16 and the embedded oxide film 35, using the array as third bit lines. Although FIG. 19 shows the case of the complete depletion type, there may be a partial depletion type. In the above case, the resistance of the bodies, which become the third bit lines, is reduced, making it possible to increase the operating speed of the element.

The procedure for producing the semiconductor device of the present embodiment will be described next. First of all, the element isolation regions 16 are formed on the SOI substrate 160. Thereafter, an impurity is injected into the bodies 36 so that the memory element comes to have an appropriate threshold value. The formation of the superstructure subsequent to this is similar to the procedure shown in the fifth embodiment.

The semiconductor device of the present embodiment can obtain the following effects in addition to the effects obtained by the memory cell array of the sixth or seventh embodiment. In the semiconductor device of the present embodiment, the electrostatic capacity between the bodies and the silicon substrate can be remarkably reduced by virtue of the existence of the thick embedded oxide film. In contrast to this, in the memory cell array of the sixth or seventh embodiment, the electrostatic capacity between the shallow well regions and the deep well region is considerably large. Moreover, if the SOI substrate is employed, then a junction capacitance between the N⁺ active layer and the bodies can be remarkably reduced. Therefore, in the memory cell array of the present embodiment, consumption current for charging the capacitance can be reduced. Furthermore, if the SOI substrate is employed, it is easy to shallow the depth of the N⁺ active layer, and the short-channel effect can be controlled, allowing the element to be further miniaturized. For the above reasons, a reduction in the power consumption and miniaturization can be achieved by employing the SOI substrate.

NINTH EMBODIMENT

If the memory element or the semiconductor storage device of the first through eighth embodiments is integrated into an integrated circuit, then the element or device can be operated on a low power voltage, allowing the integrated circuit to have low power consumption.

It is also acceptable to mount the memory element or the semiconductor storage device of the fourth through eighth embodiments together with a logic circuit on one integrated circuit. It is further acceptable to additionally mount another memory (DRAM, SRAM or the like) together with the memory element or the semiconductor storage device and the logic circuit. For example, if the memory cell array of the sixth through eighth embodiments is employed, then the cell area is $4F^2$, which is smaller than the memory cell area of the ordinary one-transistor type nonvolatile memory. Therefore, the areas of the logic circuit and other memories can be increased by the reduction in the area occupied by the memory, and the functions can be improved. Otherwise, the storage capacity of the memory of the semiconductor device of the present embodiment can be increased. In the above case, it is possible to temporarily read, for example, a large-scale program, retain the program after the power is cut off and execute the program after the power is turned on again, and it is also possible to replace the program with another program.

Figure 20:
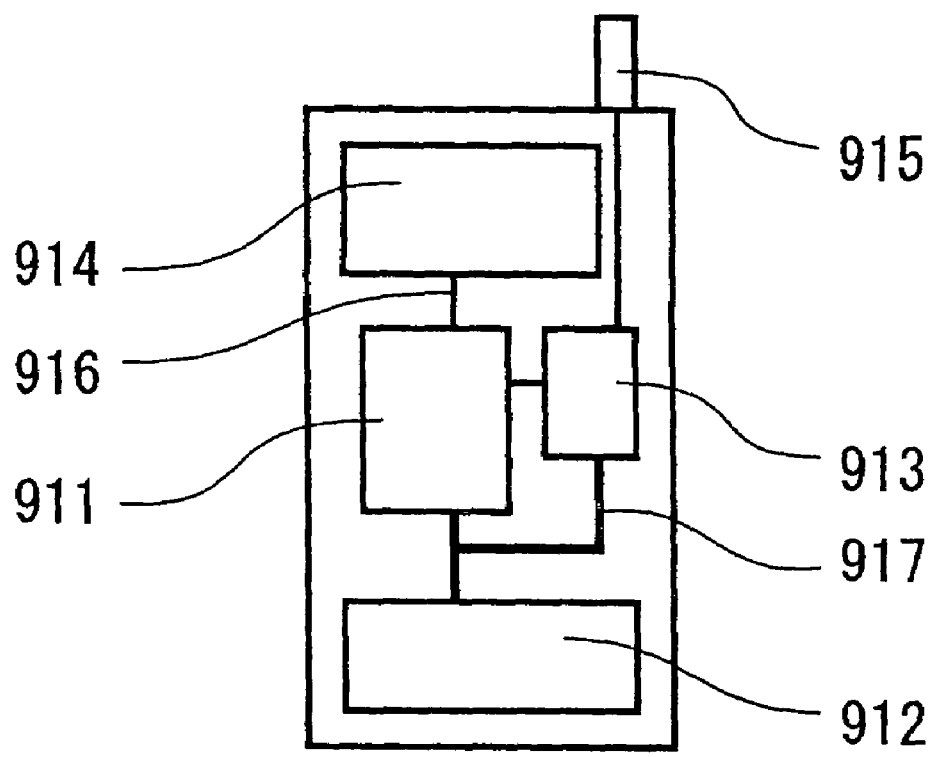
FIG. 20 is a schematic view of a portable information-processing apparatus according to a ninth embodiment of the present invention.

It is further possible to integrate the aforementioned integrated circuit into portable electronic equipment operating on a battery. As the portable electronic equipment, there can be enumerated a portable information terminal, a portable telephone, a game machine and so on. FIG. 20 shows an example of the portable telephone. The semiconductor integrated circuit of the present invention is built in a control circuit 911. The control circuit 911 may be constructed of an LSI in which the memory circuit of the present invention and a logic circuit are mounted together. There are shown a battery 912, an RF circuit section 913, a display section 914, an antenna section 915, a signal line 916 and a power supply line 917. By employing the semiconductor integrated circuit of the present invention in portable electronic equipment, it becomes possible to make the portable electronic equipment have high functions and largely reduce the power consumption of the LSI section. With the above arrangement, the operating life of the battery can be remarkably increased.

The invention claimed is:

1. A memory film manufacturing method comprising the steps of:

forming a first insulation film on a semiconductor substrate functioning as a first electrode;

forming a first conductor film on the first insulation film;

forming a second insulation film on a surface of the first conductor film;

forming a third insulation film containing conductor particles on the second insulation film; and forming a second conductor film as a second electrode on the third insulation film, wherein the conductor particles contained in the third insulation film comprise:

first conductor particles located adjacent to the first conductor film; and second conductor particles located obliquely upwardly adjacent to the first semiconductor particles, and the positions of the first conductor particles projected on a plane of the first conductor film are substantially random, and wherein assuming that a diameter or a height of the conductor particles is H, assuming that a distance between the first conductor film and the first conductor particles is $S_1$, and assuming that an average of a thickness of the third insulation film is W, then there is satisfied the relation:

$W \leq 2H + S_1$.

2. The memory film manufacturing method as claimed in claim 1, wherein
the step of forming the third insulation film containing the conductor particles on the second insulation film is comprised of performing at least one time a sequence of the steps of:
forming the conductor particles on the second insulation film; and
forming the third insulation film on surfaces of the conductor particles.

3. The memory film manufacturing method as claimed in claim 2, wherein
the sequence of steps is carried out two times or three times.

4. The memory film manufacturing method as claimed in claim 2, wherein
the first conductor film is comprised of a semiconductor,
the conductor particles are comprised of a semiconductor,
the step of forming the first insulation film on the semiconductor substrate,
the step of forming the second insulation film on the surface of the conductor film and the step of forming the third insulation film on the surfaces of the conductor particles are comprised of a thermal oxidation process, and
the step of forming the first conductor film on the first insulation film, and
the step of forming the conductor particles on the second insulation film are comprised of a chemical vapor deposition method.

5. The memory film manufacturing method as claimed in claim 4, wherein
the first conductor film is comprised of a polycrystalline semiconductor or an amorphous semiconductor.

6. The memory film manufacturing method as claimed in claim 1, wherein
the semiconductor substrate is comprised of a silicon substrate,
the first conductor film is comprised of silicon,
the first through third insulation films are each comprised of a silicon oxide film, and
the conductor particles are each comprised of silicon.

7. A memory film manufacturing method comprising the steps of:
forming a first insulation film on a semiconductor substrate;
forming an amorphous semiconductor film on the first insulation film;
cleaning the amorphous semiconductor film by exposure to atmosphere after the step of forming the amorphous semiconductor film;
producing a semiconductor nucleus by introducing gas containing either one or both of $Si_2H_6$ gas and $SiH_4$ gas onto the amorphous semiconductor film;
forming a first oxide film by thermally oxidizing part of the amorphous semiconductor film and part of the semiconductor nucleus and then forming first semiconductor particles; and
forming a second conductor film on the first oxide film.

8. A memory film manufacturing method comprising the steps of:
forming a first insulation film on a semiconductor substrate;
forming an amorphous semiconductor film on the first insulation film;
cleaning the amorphous semiconductor film by exposure to atmosphere after the step of forming the amorphous semiconductor film;
producing a semiconductor nucleus by introducing gas containing either one or both of $Si_2H_6$ gas and $SiH_4$ gas onto the amorphous semiconductor film;
forming a first oxide film by thermally oxidizing part of the amorphous semiconductor film and part of the semiconductor nucleus and then forming first semiconductor particles;
forming second conductor particles on the first oxide film;
forming a third insulation film on surfaces of the second conductor particles; and
forming a second conductor film on the third insulation film.

9. A memory film manufacturing method comprising the steps of:
forming a first insulation film on a semiconductor substrate;
forming an amorphous semiconductor film on the first insulation film;
producing a semiconductor nucleus by introducing gas containing either one or both of $Si_2H_6$ gas and $SiH_4$ gas onto the amorphous semiconductor film without exposure to atmosphere after the step of forming the amorphous semiconductor film;
forming a first oxide film by oxidizing part of the amorphous semiconductor film and part of the semiconductor nucleus through thermal oxidation and then forming first semiconductor particles; and
forming a second conductor film on the first oxide film.

10. A memory film manufacturing method comprising the steps of:
forming a first insulation film on a semiconductor substrate;
forming an amorphous semiconductor film on the first insulation film;
producing a semiconductor nucleus by introducing gas containing either one or both of $Si_2H_6$ gas and $SiH_4$ gas onto the amorphous semiconductor film without exposure to atmosphere after the step of forming the amorphous semiconductor film;
forming a first oxide film by oxidizing part of the amorphous semiconductor film and part of the semiconductor nucleus through thermal oxidation and then forming first semiconductor particles;
forming second conductor particles on the first oxide film;
forming a third insulation film on surfaces of the second conductor particles; and
forming a second conductor film on the third insulation film.

11. The memory film manufacturing method as claimed in claim 7, wherein
the semiconductor nucleus is grown by carrying out annealing without exposure to atmosphere after the step of generating the semiconductor nucleus by introducing gas containing either one or both of $Si_2H_6$ gas and $SiH_4$ gas onto the amorphous semiconductor film.

12. A memory film comprising:
a semiconductor substrate functioning as a first electrode;
a first insulation film formed on the semiconductor substrate; a first conductor film formed on the First insulation film;
a third insulation film containing conductor particles formed on the first conductor film; and
a second conductor film as a second electrode formed on the third insulation film, wherein the conductor particles contained in the third insulation film comprise:
first conductor particles located adjacent to the first conductor film; and
second conductor particles located obliquely upwardly adjacent to the first semiconductor particles, and
the positions of the first conductor particles projected on a plane of the first conductor film are substantially random,
and wherein
assuming that a diameter or a height of the conductor particles is H,
assuming that a distance between the first conductor film and the first conductor particles is $S_1$, and
assuming that an average of a thickness of the third insulation film is W, then there is satisfied the relation:

$$W \leq 2H + S_1.$$

13. The memory film as claimed in claim 12, wherein positions of the conductor particles contained in the third insulation film are substantially random.

14. The memory film as claimed in claim 12, wherein the conductor particles contained in the third insulation film comprise:
first conductor particles located adjacent to the first conductor film; and
second conductor particles located obliquely upwardly adjacent to the first semiconductor particles, and
the positions of the first conductor particles projected on a plane of the first conductor film are substantially random.

15. The memory film as claimed in claim 12, wherein
the semiconductor substrate is a silicon substrate,
the first conductor film is comprised of silicon,
the first and third insulation films are each comprised of a silicon oxide film, and
the conductor particles are comprised of silicon.

16. The memory film as claimed in claim 12, wherein
a thickness of the first insulation film is 2 nm to 5 nm, and
a diameter of the conductor particles is 3 nm to 7 nm.

17. A memory element, wherein a gate insulation film of a field-effect transistor is comprised of the memory film claimed in claim 12.

18. The memory element as claimed in claim 17, which is formed on a SOI substrate.

19. A semiconductor integrated circuit, wherein the memory element claimed in claim 17 is integrated.

20. A semiconductor storage device, wherein element isolation regions that extend meandering in a first direction on a surface of a semiconductor substrate are formed so as to be arranged parallel in a second direction perpendicular to the first direction, defining active regions that extend meandering in the first direction between mutually adjacent ones of the element isolation regions,
impurity diffusion regions, which operate as a source region or a drain region, are formed at turn portions of the meander in each of the active regions, are formed, defining channel regions between mutually adjacent ones of the impurity diffusion regions in an identical active region,
a plurality of word lines, which extend in the second direction perpendicular to the first direction, are provided on the semiconductor substrate so as to extend over the channel regions in each of the active regions via the memory film,
first bit lines, which extend in the first direction, are provided on the semiconductor substrate so as to extend over the impurity diffusion regions provided at the turn portions on one side of the meander in the identical active region, second bit lines, which extend in the first direction, are provided so as to extend over the impurity diffusion regions provided at the turn portions on the other side of the meander in the identical active region,
the first bit lines and the second bit lines are connected to the impurity diffusion regions existing right thereunder via contact holes, and
the semiconductor substrate has a well region on a surface side, the well region being segmented by the element isolation regions.

21. A semiconductor storage device, wherein
element isolation regions, which extend meandering in a first direction, are formed on a surface of a semiconductor substrate so as to be arranged parallel in a second direction perpendicular to the first direction, defining active regions that extend meandering in the first direction between mutually adjacent ones of the element isolation regions,
impurity diffusion regions, which operate as a source region or a drain region, are formed at turn portions of the meander in each of the active regions, defining channel regions between mutually adjacent impurity diffusion regions in an identical active region,
a plurality of word lines, which extend in the second direction perpendicular to the first direction, are provided on the semiconductor substrate so as to extend over the channel regions in each of the active regions via the memory film claimed in claim 12,
first bit lines, which extend in the first direction, are provided on the semiconductor substrate so as to extend over the impurity diffusion regions provided at the turn portions on one side of the meander in the identical active region, second bit lines, which extend straightly in the first direction, are provided so as to extend over the impurity diffusion regions provided at the turn portions on the other side of the meander in the identical active region,
the first bit lines and the second bit lines are connected to the impurity diffusion regions existing right thereunder via contact holes, and
a SOI substrate, which has a body comprised of silicon, is provided as the semiconductor substrate on an insulator, the body of the SOI substrate constituting the active regions.

22. The semiconductor storage device as claimed in claim 20, wherein
a portion of the word lines, the portion being located on the channel region, constitutes a gate electrode.

23. A semiconductor storage device, wherein
element isolation regions that extend meandering in a first direction on a surface of a semiconductor substrate are formed so as to be arranged parallel in a second direction perpendicular to the first direction, defining active regions that extend meandering in the first direction between mutually adjacent ones of the element isolation regions,
impurity diffusion regions, which operate as a source region or a drain region, are formed at turn portions of the meander in each of the active regions, are formed, defining channel regions between mutually adjacent ones of the impurity diffusion regions in an identical active region,
a plurality of word lines, which extend in the second direction perpendicular to the first direction, are provided on the semiconductor substrate so as to extend over the channel regions in each of the active regions via a memory film comprising:
- a semiconductor substrate functioning as a first electrode;
- a first insulation film formed on the semiconductor substrate;
- a first conductor film formed on the first insulation film;
- a third insulation film containing conductor particles formed on the first conductor film; and
- a second conductor film as a second electrode formed on the third insulation film, first bit lines, which extend in the first direction, are provided on the semiconductor substrate so as to extend over the impurity diffusion regions provided at the turn portions on one side of the meander in the identical active region, second bit lines, which extend in the first direction, are provided so as to extend over the impurity diffusion regions provided at the turn portions on the other side of the meander in the identical active region, the first bit lines and the second bit lines are connected to the impurity diffusion regions existing right thereunder via contact holes, and the semiconductor substrate has a well region on a surface side, the well region being segmented by the element isolation regions, wherein during write and erase, when an absolute value V of a potential difference between the word line and the body is $V=V_{DD}$ in a selected memory cell, there is a relation: $V_{DD}/3 \leq V < V_{DD}/2$ in a memory cell connected only to either one of the selected word line or the selected bit line.

24. A semiconductor integrated circuit, wherein the semiconductor storage device claimed in claim 20 or 21 and a logic circuit are mounted together.

25. Portable electronic equipment provided with the semiconductor integrated circuit claimed in claim 19.

26. Portable electronic equipment provided with the semiconductor integrated circuit claimed in claim 24.

* * * * *